US007710200B2

(12) United States Patent
Cho et al.

(10) Patent No.: US 7,710,200 B2
(45) Date of Patent: May 4, 2010

(54) OUTPUT BUFFER AND POWER AMPLIFIER COMPRISING THEREOF

(75) Inventors: Gyu Hyeong Cho, Gongju-si (KR); Tae-Woo Kwak, Daegu (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 12/028,856

(22) Filed: Feb. 11, 2008

(65) Prior Publication Data
US 2009/0033423 A1    Feb. 5, 2009

(30) Foreign Application Priority Data
Aug. 2, 2007    (KR) ....................... 10-2007-0077771
Aug. 2, 2007    (KR) ....................... 10-2007-0077782

(51) Int. Cl.
*H03F 3/18*    (2006.01)

(52) U.S. Cl. ........................ 330/264; 330/267

(58) Field of Classification Search ............... 330/255, 330/261, 264, 267, 269, 262, 263, 268
See application file for complete search history.

(56) References Cited

U.S. PATENT DOCUMENTS 6,166,603 A * 12/2000 Smith .......................... 330/263
6,552,613 B2 * 4/2003 Murray et al. ............... 330/255

* cited by examiner

*Primary Examiner*—Khanh V Nguyen
(74) *Attorney, Agent, or Firm*—The Belles Group, PC

(57) ABSTRACT

The present invention relates an output buffer and a power amplifier having the same. The output buffer includes a push-pull circuit unit, an output unit, and a driver. The push-pull circuit unit includes transistors connected to each others in a push-pull formation between a high level power voltage and a low level power voltage. The output unit is connected to the high level power voltage and the low level power voltage, and the driver drives the output unit according to a signal from the push-pull circuit unit.

39 Claims, 21 Drawing Sheets

Prior Art

Prior Art

Prior Art

Prior Art

Prior Art

Prior Art

OUTPUT BUFFER AND POWER AMPLIFIER COMPRISING THEREOF

RELATED APPLICATIONS

This Nonprovisional application claims priorities under 35 U.S.C. §119(a) on Patent Applications No. 10-2007-0077771, 10-2007-0077782 filed in Republic of Korea on Aug. 2, 2007, the entire contents of which are hereby incorporated by reference.

BACKGROUND OF THE INVENTION

1. Field of the Invention

The present invention relates to an output buffer and a power amplifier having the same. More particularly, the present invention relates to an output buffer having low output impedance and a power amplifier having the same.

2. Description of the Background Art

FIG. 1 is a circuit diagram of a NMOS source follower. Referring to FIG. 1, comparative low output impedance can be obtained because an output voltage $V_o$ is obtained from a source node of a transistor $M_{NSF}$. However, the output voltage $V_o$ cannot increase higher than a value obtained by subtracting voltage drop $V_{gs}$ from a gate voltage due to the voltage drop $V_{gs}$ between a gate and a source. Therefore, the shown structure has a problem of a narrow swing range of the output voltage $V_o$.

FIG. 2 is a circuit diagram that lowers output impedance of a PMOS common source through a negative feedback using an operational transconductance amplifier (OTA). Referring to FIG. 2, it is possible to swing an output voltage until a transistor $M_{PCS}$ falls into a triode region because an output voltage $V_o$ is obtained from a drain node of a transistor $M_{PCS}$. That is, the output voltage may increase up to $V_{dd}$-$V_{dsat}$. Here, $V_{dd}$ denotes a high level power voltage and $V_{dsat}$ is an overdrive voltage. However, a PMOS common source amplifier has a shortcoming that output impedance is dynamic resistance, which is very large. Accordingly, a structure lowering impedance of an output node through a negative feedback using an operational transconductance amplifier (OTA) is introduced as shown in FIG. 2. In such a structure, output impedance is small at a low frequency zone where a gain of an OTA is large. However, output impedance becomes increased because a gain of an OTA decreases as a frequency increases. Therefore, low impedance cannot be obtained.

FIG. 3 is a circuit diagram illustrating an output stage that lowers output impendence using a negative feedback loop composed of a NMOS source follower, a PMOS common source amplifier, and a PMOS common gate amplifier. Referring to FIG. 3, the shown structure obtains very low output impedance that could not be obtained by a typical CMOS circuit by further lowering low output impedance of an NMOS source follower $M_{NSF}$ by connecting a NMOS source follower $M_{NSF}$ and a PMOS common source amplifier $M_{PCS}$. The shown structure has a wide bandwidth characteristic because only one low frequency pole exists in a negative feedback loop, and very low output impedance can be sustained in a high frequency band thereby. However, a swing range of an output voltage is limited at a predetermined area as shown in FIG. 4 due to a NMOS source follower $M_{NSF}$ like FIG. 1 according to FIG. 3.

FIG. 4 is a graph showing an operating zone of an output electric current $I_o$ for an output voltage $V_o$ of FIG. 3.

Referring to FIG. 4, there are four quadrants presented when relation of an output electric current $I_o$ for an output voltage $V_o$ is illustrated. Throughout the specification, if an output stage is operable at four quadrants, it is defined as the output stage performs four-quadrant operation, and if the output stage is operable at two sections of a quadrant, it is defined as the output stage performs two-quadrant operation for convenience. Although dual supply voltage was described, single supply voltage can be applied to an output stage structure according to the present invention without changing any structure. However, an intermediate value of an output voltage is ½ of a power source voltage for a single supply voltage although an intermediate value of an output voltage is 0 for dual supply voltage.

FIG. 5 is a circuit diagram illustrating an output stage that lowers output impedance using a negative feedback loop composed of a PMOS source follower, a PMOS common source amplifier, and a NMOS common gate amplifier, and FIG. 6 is a diagram illustrating an operation zone of an output electric current $I_o$ for an output voltage $V_o$ of FIG. 5. Referring to FIGS. 5 and 6, the output stage of FIG. 5 is different from that of FIG. 3 in which a PMOS source follower $M_{PSF}$ is connected to a PMOS common source amplifier $M_{PCS}$. Unlike the output stage of FIG. 3 that uses a common gate amplifier formed of a PMOS transistor $M_{P1}$ for forming a negative feedback loop, the output stage of FIG. 5 uses a common gate amplifier formed of a NMOS transistor $M_{N1}$. Since the PMOS source follower $M_{PSF}$ is used, an output voltage cannot decrease a lot due to the PMOS source follower $M_{PSF}$ in the output stage of FIG. 5. Except that, the output stage of FIG. 5 has the same characteristics of the output stage shown in FIG. 3. FIG. 6 is a region where an output voltage is limited by a PMOS source follower $M_{PSF}$.

SUMMARY OF THE INVENTION

Accordingly, an aspect of the present invention is to solve at least the problems and disadvantages of the background art. In accordance with an aspect of the present invention, an output buffer includes a push-pull circuit unit including transistors connected to each others in a push-pull formation between a high level power voltage and a low level power voltage, an output unit connected to the high level power voltage and the low level power voltage, and a driver for driving the output unit according to a signal from the push-pull circuit unit.

Output impedance may be lowered by forming negative feedback loops with the push-pull circuit unit, the output unit, and the driver.

The push-pull circuit unit may include a NMOS source follower and a PMOS source follower, which are connected in the push-pull formation.

The driver may include a PMOS common gate having a source connected to a drain of the NMOS source follower, and a NMOS common gate having a drain connected to a drain of the PMOS common gate and a source connected to a drain of the PMOS source follower.

The output unit may include a PMOS common source having a source connected to the high level power voltage and a drain connected to an output node.

The output impedance may be lowered by forming a first negative feedback loop with the NMOS source follower, the PMOS common gate, and the PMOS common source and by forming a second negative feedback loop with the PMOS source follower, the NMOS common gate, and the PMOS common source.

In accordance with another aspect of the present invention, an output buffer includes: a push-pull circuit unit including transistors connected in a push-pull formation between a high level power voltage and a low level power voltage; an output unit connected between the high level power voltage and the low level power voltage; a driver for driving the output unit according to a signal from the push-pull circuit unit; and a rail-to-rail controller for widening a swing range of the output voltage by controlling ON-OFF of the transistors included in the push-pull circuit unit according to an input voltage.

The output impedance may be lowered by forming negative feedback loops with the push-pull circuit unit, the output unit, and the driver.

The push-pull circuit may include a NMOS source follower and a PMOS source follower connected in the push-pull formation.

The driver may include a first amplifier having an input connected to a drain of the NMOS source follower, and a second amplifier having an output connected to an output of the first amplifier and an input connected to a drain of the PMOS source follower.

The driver may include a PMOS common gate having a source connected to a drain of the NMOS source follower, and a NMOS common gate having a drain connected to a drain of the PMOS common gate and a source connected to a drain of the PMOS source follower.

The output unit may include a PMOS common source having a source connected to the high level power voltage and a drain connected to an output node.

The rail-to-rail controller may include a first switch for controlling ON-OFF of the NMOS source follower, and a second switch for controlling ON-OFF of the PMOS source follower.

When the input voltage is a middle level, the first switch may be turned on so as to form a first negative feedback loop with the NMOS source follower, the PMOS common gate, and the PMOS common source and the second switch may be turned on so as to form a second negative feedback loop with the PMOS source follower, the NMOS common gate, and the PMOS common source.

When the input voltage is a high level, the first switch may be turned off so as to form a second negative feedback loop with the PMOS source follower, the NMOS common gate, and the PMOS common source.

When the input voltage is a low level, the second switch may be turned off so as to form a first negative feedback loop with the NMOS source follower, the PMOS common gate, and the PMOS common source.

In accordance with still another aspect of the present invention, an output buffer includes a push-pull circuit unit including transistors connected to each others in a push-pull formation between a high level power voltage and a low level power voltage, an output unit including common sources connected between the high level power voltage and the low level power voltage, an output bias unit for biasing the output unit, a driver for driving the output unit according to a signal from the push-pull circuit unit, and a rail-to-rail controller for widening a swing range of the output voltage by controlling ON-OFF of the transistors included in the push-pull circuit unit according to an input voltage.

Output impedance may be lowered by forming negative feedback loops with the push-pull circuit unit, the output unit, and the driver.

The push-pull circuit unit may include a NMOS source follower and a PMOS source follower connected in the push-pull formation.

The output unit may include a PMOS common source having a source connected to the high level power voltage and a drain connected to an output node and a NMOS common source having a drain connected to the output node and a source connected to the low level power voltage.

The rail-to-rail controller may include a first switch for controlling ON-OFF of the NMOS source follower, and a second switch for controlling ON-OFF of the PMOS source follower.

The driver may include: a first amplifier having an input connected to a drain of the NMOS source follower, and an output commonly connected to the output bias unit and a gate of the PMOS common source, and a second amplifier having an output commonly connected to the output bias unit and a gate of the NMOS common source and an input connected to a drain of the PMOS source follower.

When the input voltage is a middle level, the first switch may be turned on so as to form a first negative feedback loop with the NMOS source follower, the first amplifier, and the PMOS common source and a third negative feedback loop with the NMOS source follower, the first amplifier, and the NMOS common source, and the second switch is turned on so as to form a second negative feedback loop with the PMOS source follower, the second amplifier, and the PMOS common source, and a fourth negative feedback loop with the PMOS source follower, the second amplifier, and the NMOS common source.

The input voltage is a high level, the first switch may be turned off so as to form a second negative feedback loop with the PMOS source follower, the second amplifier, and the PMOS common source, and a fourth negative feedback loop with the PMOS source follower, the second amplifier, and the NMOS common source.

When the input voltage is a low level, the second switch may be turned off so as to form a first negative feedback loop with the NMOS source follower, the first amplifier, and the PMOS common source and a third negative feedback loop with the NMOS source follower, the first amplifier, and the NMOS common source.

The driver may include a common gate type of a first PMOS field effect transistor having a source connected to a drain of the NMOS source follower and a drain connected to the output bias unit and a common gate type of a first NMOS field effect transistor having a drain connected to the output bias unit and a source connected to a drain of the PMOS source follower.

The output bias unit may include a first translinear loop for biasing the PMOS common source, and a second translinear loop for biasing the NMOS common source.

The driver may include a first PMOS field effect transistor, a second PMOS field effect transistor, a first NMOS field effect transistor, and a second NMOS field effect transistor. Sources of the first and second PMOS field effect transistors may be connected to a drain of the NMOS source follower. The first bias voltage may be supplied to gates of the first and second PMOS field effect transistors, a drain of the first PMOS field effect transistor is connected to a drain of the first NMOS field effect transistor, a drain of the second PMOS field effect transistor may be connected to a drain of the second NMOS field effect transistor, sources of the first and second NMOS field effect transistors may be connected to a drain of the PMOS source follower, a reference voltage may be supplied to a gate of the first NMOS field effect transistor, and a gate of the NMOS field effect transistor may be connected to the output bias unit.

The output bias unit may include a third PMOS field effect transistor for sensing a main current of the PMOS common source, a third NMOS field effect transistor for sensing a main current of the NMOS common source, and an electric current selector for supplying a voltage corresponding to a smaller electric current between the main current of the PMOS common source and the main current of the NMOS common source to a gate of the second NMOS field effect transistor.

A source of the third PMOS field effect transistor may be connected to a source of the PMOS common source, a gate of the third PMOS field effect transistor is connected to a gate of the PMOS common source and a drain of the first NMOS field effect transistor, and a drain of the third PMOS field effect transistor is connected to the electric current selector, and a source of the third NMOS field effect transistor may be connected to a source of the NMOS common source, a gate of the third NMOS field effect transistor is connected to a gate of the NMOS common source and a drain of the second NMOS field effect transistor, and a drain of the third NMOS field effect transistor is connected to the electric current selector.

The driver may includes first to fourth PMOS field effect transistors and first to fourth NMOS field effect transistors, sources of the first and second PMOS field effect transistors may be connected to a drain of the NMOS source follower, the third PMOS field effect transistor may be cascode-connected to the first PMOS field effect transistor, the fourth PMOS field effect transistor may be cascode-connected to the second PMOS field effect transistor, sources of the first and second NMOS field effect transistors may be connected to a drain of the PMOS source follower, the third NMOS field effect transistor may be cascode-connected to the first NMOS field effect transistor, the fourth NMOS field effect transistor may be cascode-connected to the second NMOS field effect transistor, a drain of the third NMOS field effect transistor may be connected to a drain of the third PMOS field effect transistor, and a drain of the fourth NMOS field effect transistor is connected to a drain of the fourth PMOS field effect transistor.

The output bias unit may control gates of the PMOS common source and the NMOS common source by comparing a reference current with a smaller electric current between main electric currents of the PMOS common source and the NMOS common source.

The output bias unit may include a PMOS sensing transistor for outputting a first sensed electric current according to a main electric current of the PMOS common source, a NMOS sensing transistor for outputting a second sensed electric current according to a main electric current of the NMOS common source, and a bias controller for controlling a gate of the PMOS common source and a gate of the NMOS common source by comparing a reference current with an electric current obtained by dividing one of the first sensed electric current and the second sensed electric current by half through current mirroring.

The channel width of the PMOS sensing transistor may be narrower than a channel width of the PMOS common source, and a channel width of the NMOS sensing transistor may be narrower than a channel width of the NMOS common source.

In accordance with further another aspect of the present invention, a power amplifier may include an output buffer including a push-pull circuit unit having transistors connected to each others in a push-pull formation between a high level power voltage and a low level power voltage, an output unit including common sources connected between the high level power voltage and the low level power voltage, an output bias unit for biasing the output unit, and a driver for driving the output unit according to a signal from the push-pull circuit unit, a rail-to-rail controller for widening a swing range of the output voltage by controlling ON-OFF of transistors included in the push-pull circuit unit according to an input voltage of the output buffer, a feedback unit for feedbacking the output voltage to an input unit, and an amplifier for amplifying difference between an input voltage and the feedbacked output voltage.

The push-pull circuit unit may include a NMOS source follower and a PMOS source follower connected in the push-pull formation.

The output unit may include a PMOS common source having a source connected to the high level power voltage and a drain connected to an output node, and a NMOS common source having a drain connected to the output node and a source connected to the low level power voltage.

The rail-to-rail controller may include a PMOS switch for controlling ON-OFF of the NMOS source follower, and a NMOS switch for controlling ON-OFF of the PMOS source follower.

The driver may include first to fourth PMOS field effect transistor, and first and fourth NMOS field effect transistors. Sources of the first and second PMOS field effect transistors may be connected to a drain of the NMOS source follower, the third PMOS field effect transistor may be cascode-connected to the first PMOS field effect transistor, the fourth PMOS field effect transistor may be cascode-connected to the second PMOS field effect transistor, sources of the first and second NMOS field effect transistors may be connected to a drain of the PMOS source follower, the third NMOS field effect transistor may be cascode-connected to the first NMOS field effect transistor, the fourth NMOS field effect transistor may be cascode connected to the second NMOS field effect transistor, a drain of the third NMOS field effect transistor may be connected to a drain of the third PMOS field effect transistor, and a drain of the fourth NMOS field effect transistor may be connected to a drain of the first PMOS field effect transistor.

The output bias unit may control gates of the PMOS common source and the NMOS common source by comparing a reference current with a smaller electric current between main electric currents of the PMOS common source and the NMOS common source.

The output bias unit may include a PMOS sensing transistor for outputting a first sensed electric current according to a main electric current of the PMOS common source, an NMOS sensing transistor for outputting a second sensed electric current according to a main electric current of the NMOS common source, and a bias controller for controlling a gate of the PMOS common source and a gate of the NMOS common source by comparing a reference current with an electric current obtained by dividing one of the first sensed electric current and the second sensed electric current by half through current mirroring.

A channel width of the PMOS sensing transistor may be narrower than a channel width of the PMOS common source, and a channel width of the NMOS sensing transistor may be narrower than a channel width of the NMOS common source.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

It is an object of the present invention to provide an output buffer and a power amplifier for effectively supplying an output electric current.

It is another object of the present invention to provide an output buffer and a power amplifier for sustaining low output impedance while supplying and absorbing electric current at a predetermined output voltage and obtains a wide output voltage swing range.

Hereinafter, preferred embodiments of the present invention will be described in detail with reference to the drawings.

Figure 1:
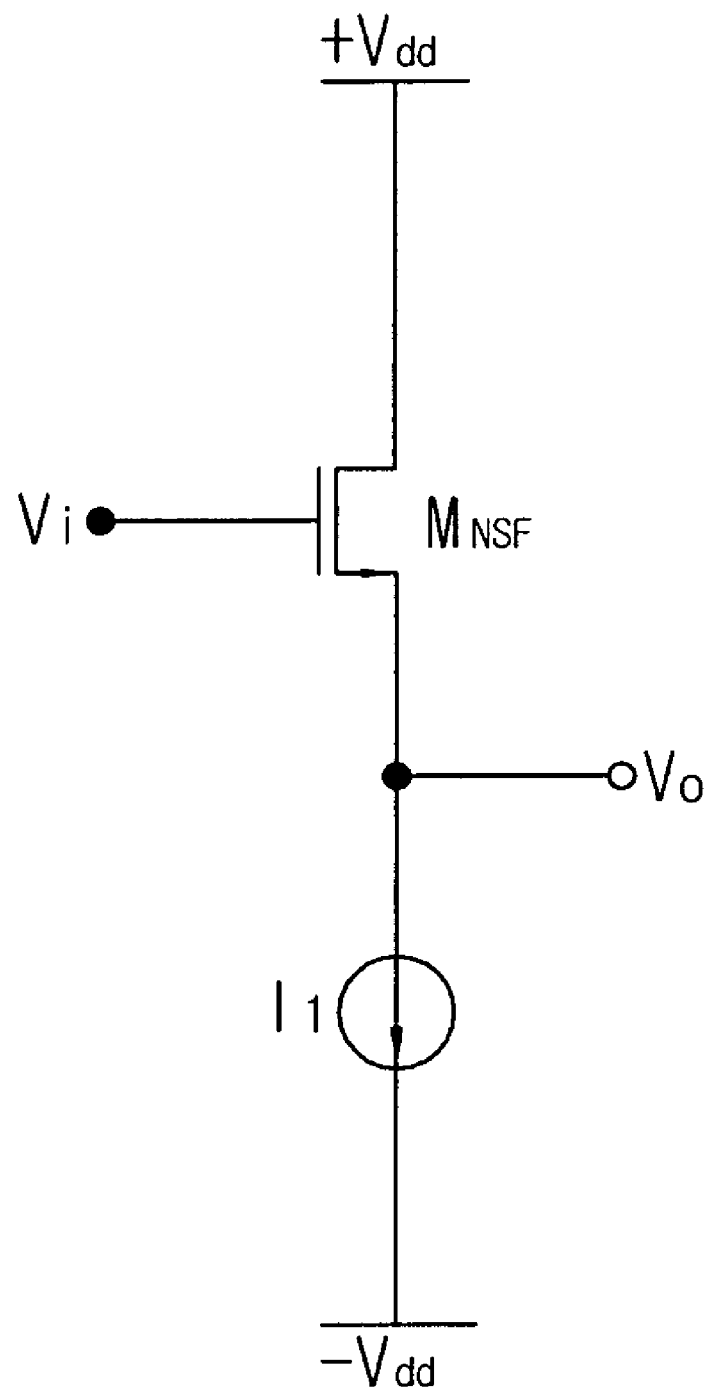
FIG. 1 is a circuit diagram of a NMOS source follower.
Figure 2:
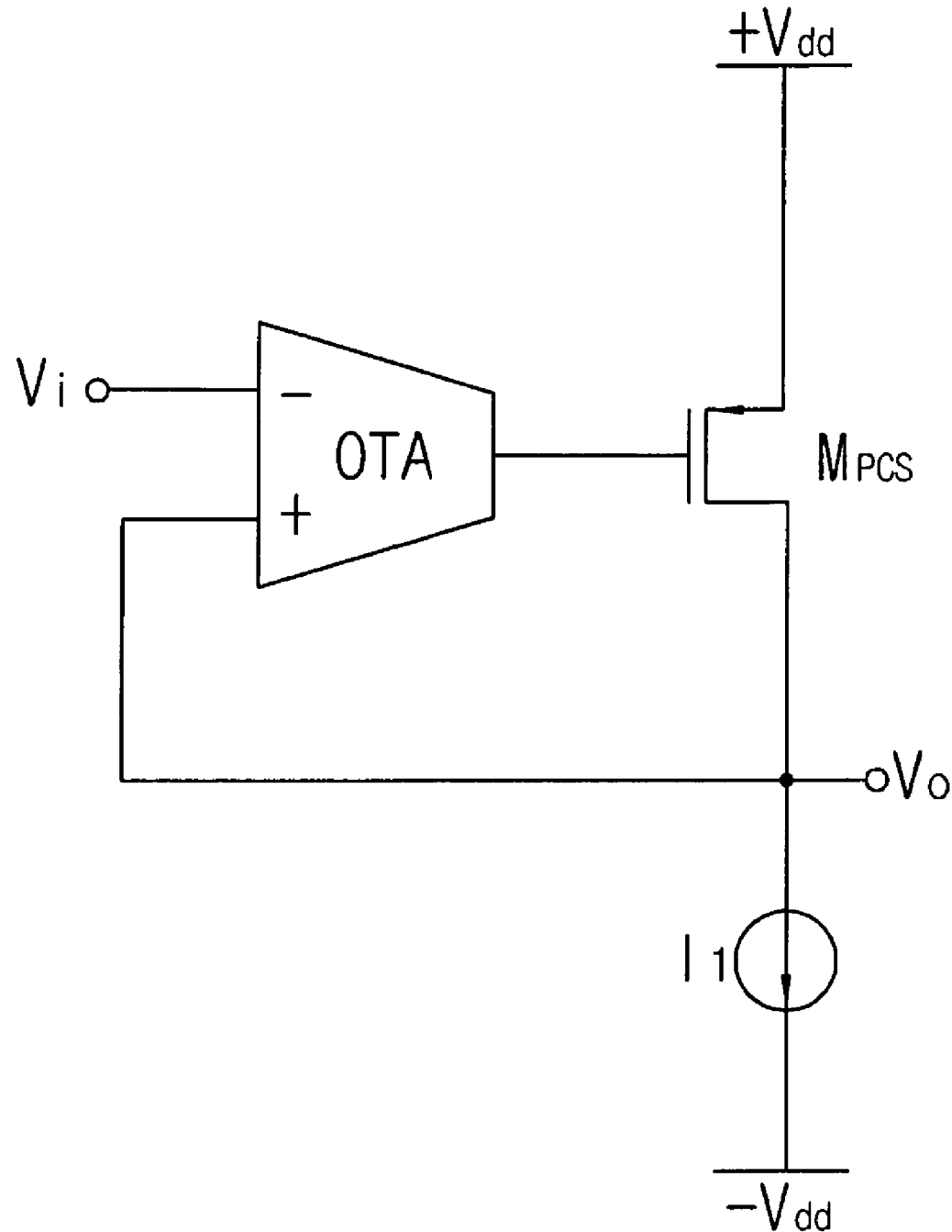
FIG. 2 is a circuit diagram that lowers output impedance of a PMOS common source through a negative feedback using an operational transconductance amplifier (OTA).
Figure 3:
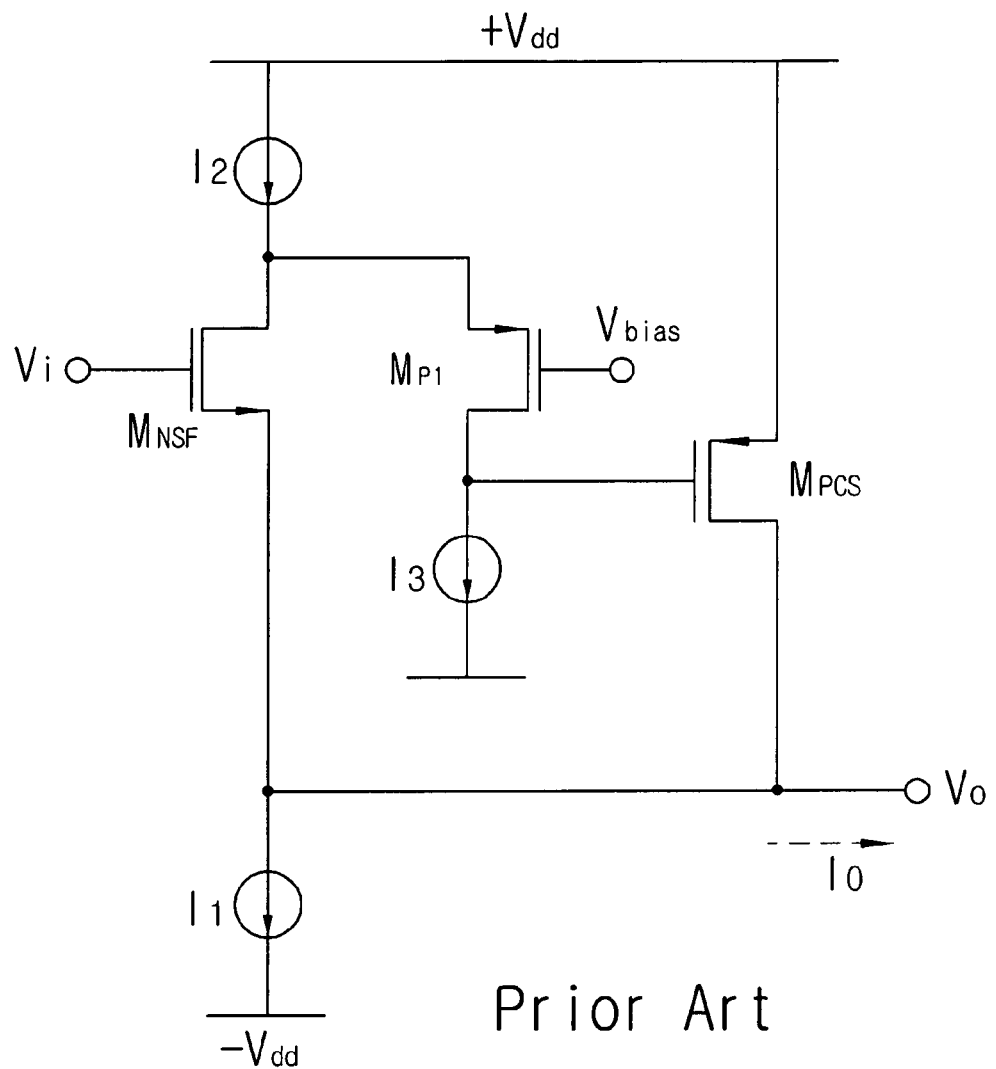
FIG. 3 is a circuit diagram illustrating an output stage that lowers output impendence using a negative feedback loop composed of a NMOS source follower, a PMOS common source amplifier, and a PMOS common gate amplifier.
Figure 4:
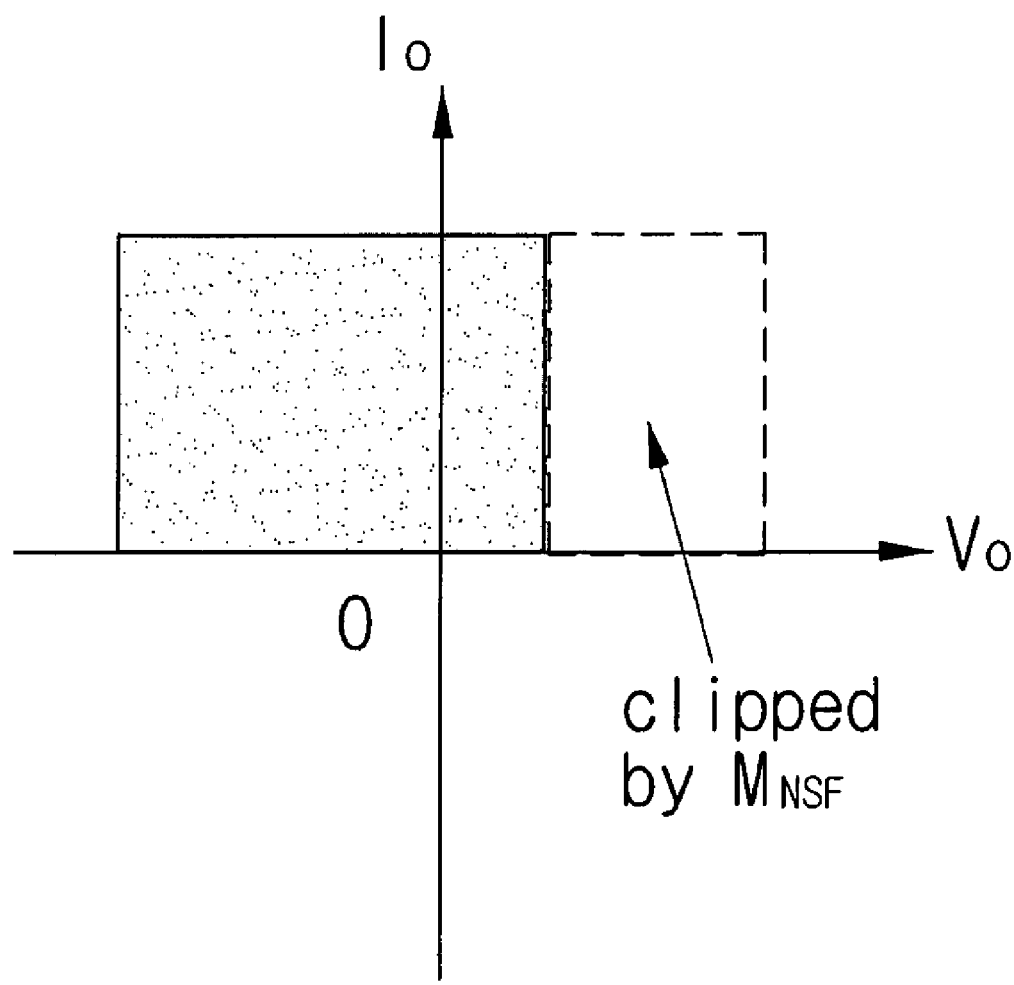
FIG. 4 is a graph showing an operating zone of an output electric current $I_o$ for an output voltage $V_o$ of FIG. 3.
Figure 5:
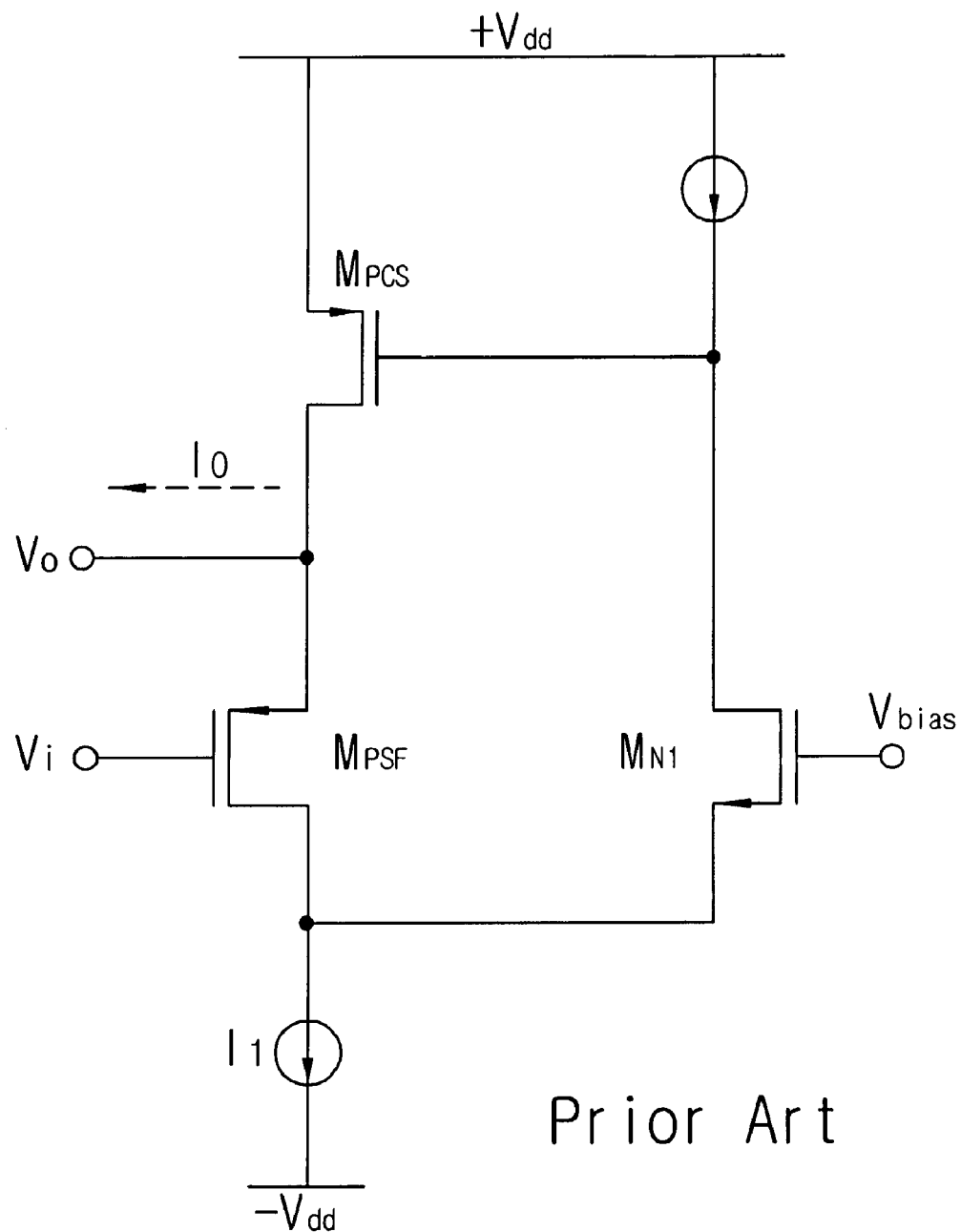
FIG. 5 is a circuit diagram illustrating an output stage that lowers output impedance using a negative feedback loop composed of a PMOS source follower, a PMOS common source amplifier, and a NMOS common gate amplifier.
Figure 6:
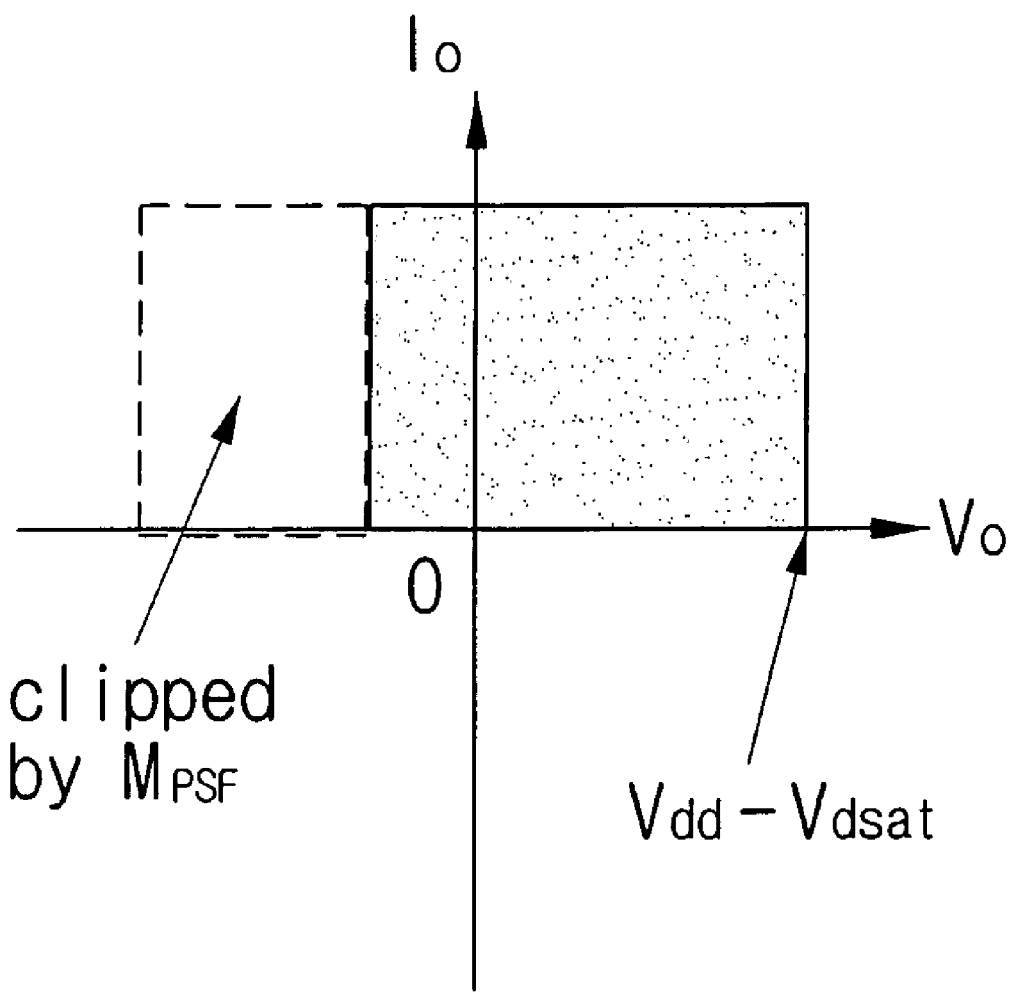
FIG. 6 is a diagram illustrating an operation zone of an output electric current $I_o$ for an output voltage $V_o$ of FIG. 5.
Figure 7:
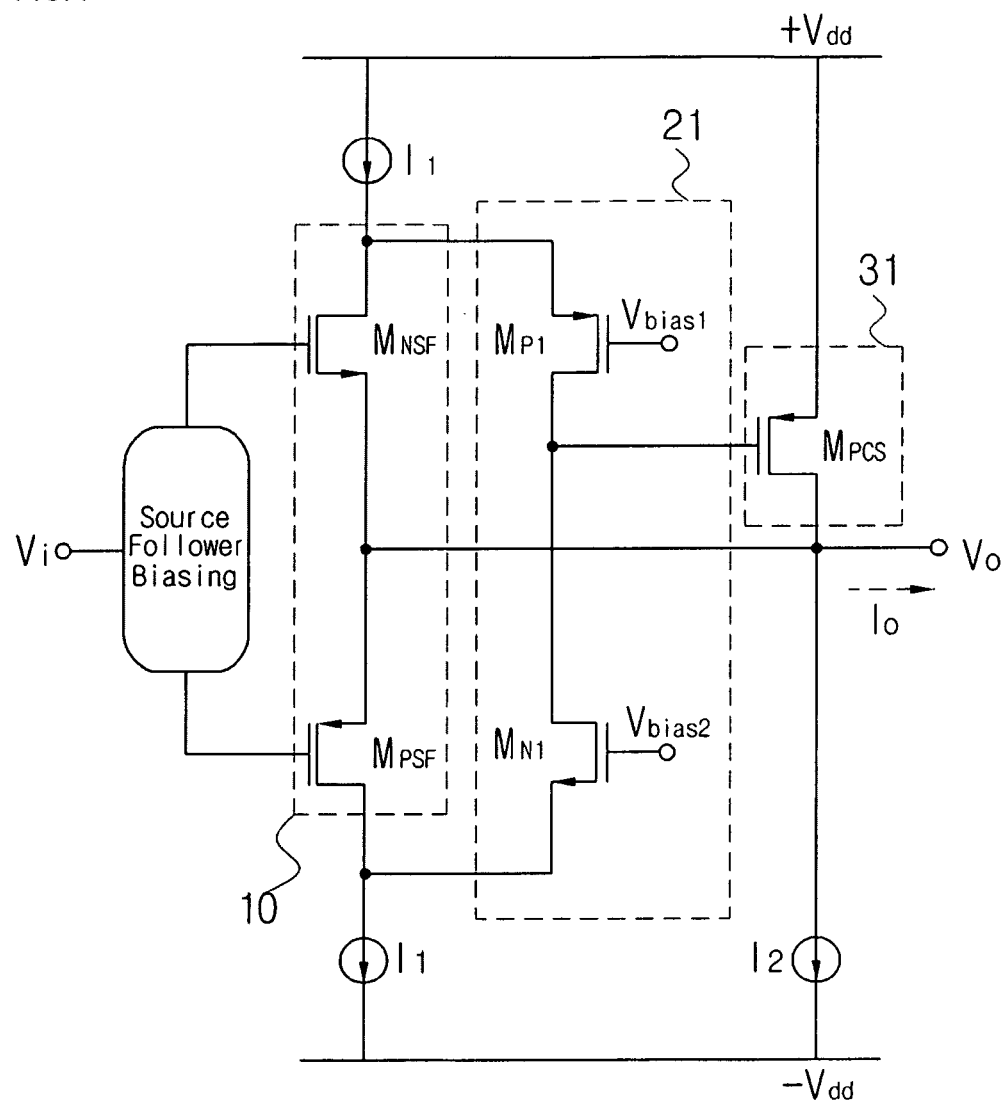
FIG. 7 is a diagram illustrating an output buffer according to a first embodiment of the present invention.
Figure 8:
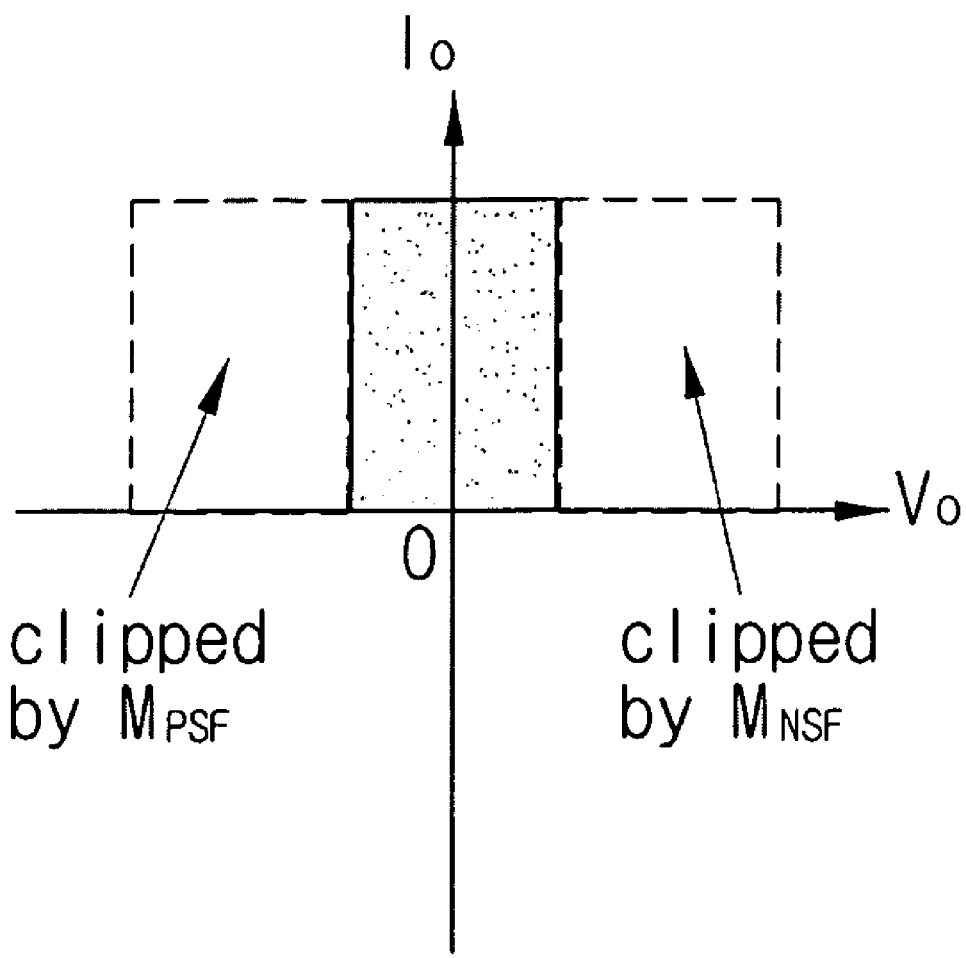
FIG. 8 is a graph showing an operation zone of an output electric current $I_o$ for an output voltage $V_o$ of an output buffer according to the first embodiment shown in FIG. 7.

FIG. 7 is a diagram illustrating an output buffer according to a first embodiment of the present invention. Referring to FIG. 7, the output buffer according to the first embodiment includes a push-pull circuit unit 10, an output unit 31, and a driver 21.

The push-pull circuit unit 10 includes transistors connected to each others in a push-pull formation between a high level power voltage $+V_{dd}$ and a low level power voltage $-V_{dd}$. In more detail, the push-pull circuit unit 10 may include a NMOS source follower $M_{NSF}$ connected to an electric current source of the high level power voltage $+V_{dd}$ side and a PMOS source follower $M_{PSF}$ connected to an electric current source of the low level power voltage $-V_{dd}$ side. The push-pull circuit unit 10 has low output impedance because of the MNOS source follower $M_{NSF}$ and the PMOS source follower $M_{PSF}$, which are connected in a push-pull formation.

The output unit 31 is connected between the high level power voltage $+V_{dd}$ and the low level power voltage $-V_{dd}$. In more detail, the output unit 31 may be a PMOS common source $M_{PCS}$ having a source connected to the high level power voltage $+V_{dd}$ and a drain connected to an output node. The output unit 31 widens a swing range of an output voltage $V_o$ and supplies most of an output electric current $I_o$.

The driver 21 drives the output unit 31 according to a signal from the push-pull circuit unit 10. The driver 21 may include a PMOS common gate $M_{P1}$ having a source connected to a drain of the NMOS source follower $M_{NSF}$ and an NMOS common gate $M_{N1}$ having a drain connected to a drain of the PMOS common gate $M_{P1}$, and a source connected to a drain of the PMOS source follower $M_{PSF}$.

Output impedance is lowered by forming negative feedback loops with the push-pull circuit unit 10, the output unit 31, and the driver 21, which are included in the output buffer according to the first embodiment. In more detail, the NMOS source follower $M_{NSF}$ included in the push-pull circuit unit 10, the PMOS common gate $M_{P1}$ included the driver 21, and the PMOS common source $M_{PCS}$ included in the output unit 31 form a first negative feedback loop $M_{NSF}$–$M_{P1}$–$M_{PCS}$. Also, the PMOS source follower $M_{PSF}$ included in the push-pull circuit unit 10, the NMOS common gate $M_{N1}$ included in the driver 21, and the PMOS common source $M_{PCS}$ included in the output unit 31 form a second negative feedback loop $M_{PSF}$–$M_{N1}$–$M_{PCS}$. The first and second negative feedback loops lower output impedance as much as times of a loop gain.

The output buffer according to the first embodiment has a better electric current supplying capability than an electric current absorbing capability. That is, the output buffer according to the first embodiment has a structure for two-quadrant operation that mainly considers a supplying side of an output electric current $I_o$. In more detail, a first negative feedback loop $M_{NSF}$–$M_{P1}$–$M_{PCS}$ is formed by connecting the NMOS source follower $M_{NSF}$ and the PMOS common gate $M_{P1}$ to the PMOS common source $M_{PCS}$ supplying most of an output electric current $I_o$ and a second negative feedback loop $M_{PSF}$–$M_{N1}$–$M_{PCS}$ is formed by connecting the PMOS source follower $M_{PSF}$ and the NMOS common gate $M_{N1}$ to the PMOS common source $M_{PCS}$. Accordingly, low output impedance can be sustained at a high frequency band because of two negative feedback loops such as the first and second negative feedback loops $M_{NSF}$–$M_{P1}$–$M_{PCS}$, $M_{PSF}$–$M_{N1}$–$M_{PCS}$.

Figure 9:
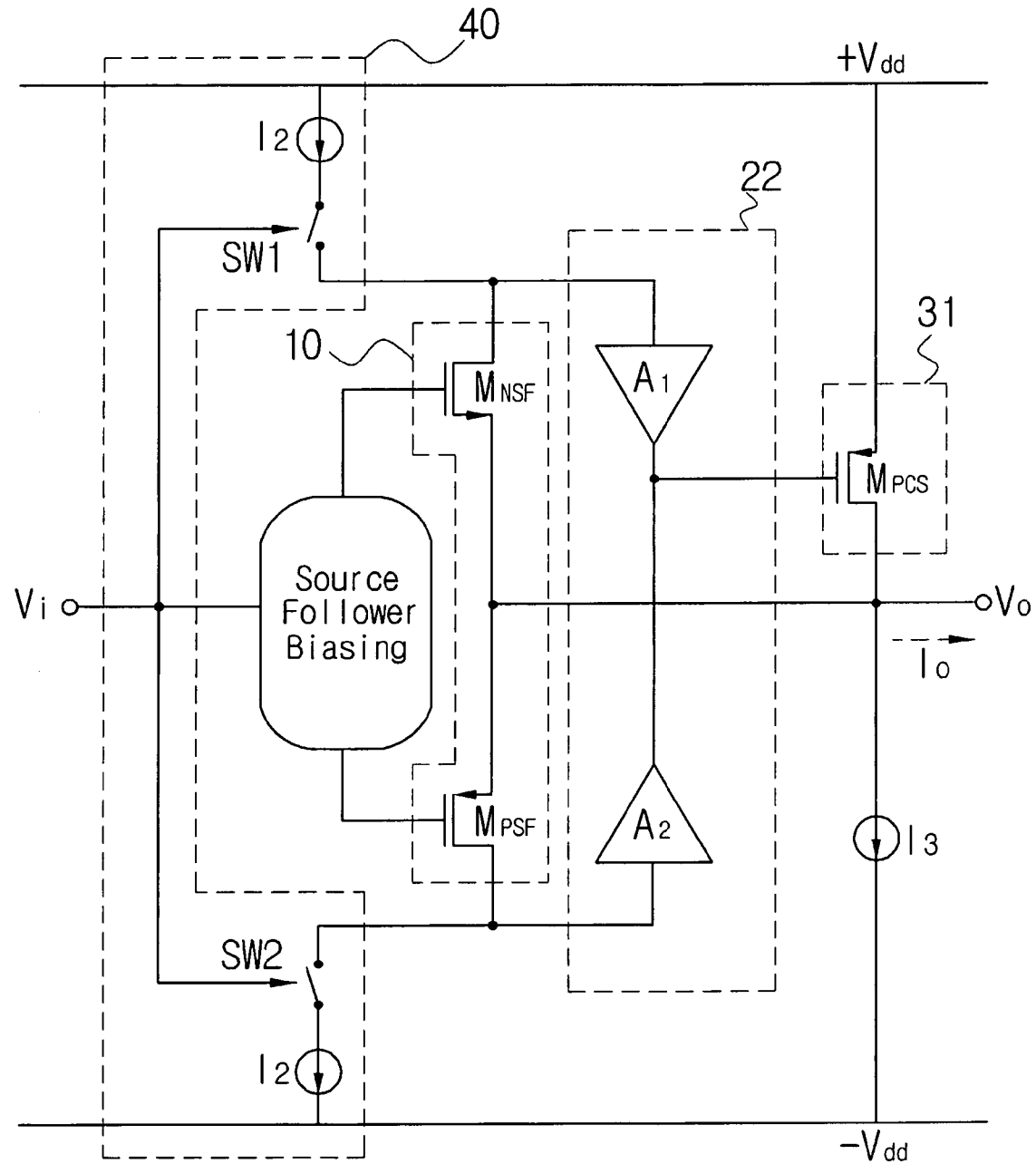
FIG. 9 is a diagram illustrating an output buffer according to a second embodiment of the present invention.

FIG. 9 is a diagram illustrating an output buffer according to a second embodiment of the present invention. Referring to FIG. 9, the output buffer according to the second embodiment includes a push-pull circuit unit 10, an output unit 31, a driver 22, and a rail-to-rail controller 40.

The push-pull circuit unit 10 includes transistors connected to each others in a push-pull formation between a high level power voltage $+V_{dd}$ and a low level power voltage $-V_{dd}$. In more detail, the push-pull circuit unit 10 may include a NMOS source follower $M_{NSF}$ connected to a current source of the high level power voltage $+V_{dd}$ side and a PMOS source follower $M_{PSF}$ connected to a current source of the low level power voltage $-V_{dd}$ side. The push-pull circuit unit 10 has low output impedance because of the NMOS source follower $M_{NSF}$ and the PMOS source follower $M_{PSF}$, which are connected in a push-pull formation.

The output unit 31 is connected between high level power voltage +$V_{dd}$ and low level power voltage −$V_{dd}$. In more detail, the output unit 31 may be a PMOS common source $M_{PCS}$ having a source connected to the high level power voltage +$V_{dd}$ and a drain connected to an output node. The output unit 31 widens a swing range of an output voltage $V_o$ and supplies most of an output electric current $I_o$.

The driver 22 drives the output unit 31 according to a signal from the push-pull circuit unit 10. The driver 22 may include a first amplifier A1 having an input connected to a drain of the NMOS source follower $M_{NSF}$ and a second amplifier A2 having an output connected to an output unit of the first amplifier and an input connected to a drain of the PMOS source follower $M_{PSF}$.

The rail-to-rail controller 40 widens a swing rage of an output voltage $V_o$ by controlling ON-OFF of transistors included in the push-pull circuit unit 10 according to an input voltage $V_i$ of the output buffer. The rail-to-rail controller 40 may include a first switch SW1 for controlling ON-OFF of the NMOS source follower $M_{NSF}$ and a second switch SW2 for controlling ON-OFF of the PMOS source follower $M_{PSF}$.

Hereinafter, the operations of the rail-to-rail controller 40 according to an input voltage $V_i$ of a buffer will be described. 1) When the input voltage $V_i$ is a middle level, the first switch SW1 is turned on, thereby forming a first negative feedback loop with the NMOS source follower $M_{NSF}$, the first amplifier A1, and the PMOS common source $M_{PCS}$, and the second switch SW2 is turned on, thereby forming a second negative feedback loop with the PMOS source follower $M_{PSF}$, the second amplifier A2, and the PMOS common source $M_{PCS}$. 2) When the input voltage $V_i$ is high level, only the second negative feedback loop is formed with the PMOS source follower $M_{PSF}$, the second amplifier A2, and the PMOS common source $M_{PCS}$ because the NMOS source follower $M_{NSF}$ is turned off by the first switch SW1 that is turned off by the high level input voltage $V_i$. 3) When an input voltage $V_i$ is low level, only the first negative feedback loop is formed with the NMOS source follower $M_{NSF}$, the first amplifier A1, and the PMOS common source $M_{PCS}$ because the PMOS source follower $M_{PSF}$ is turned off by the second switch SW2 which is turned off by the low level input voltage.

The output buffer according to the second embodiment can supply a large output electric current with low output impedance sustained even at a high frequency because at least one of the negative feedback loops is formed for any output voltages.

Figure 10:
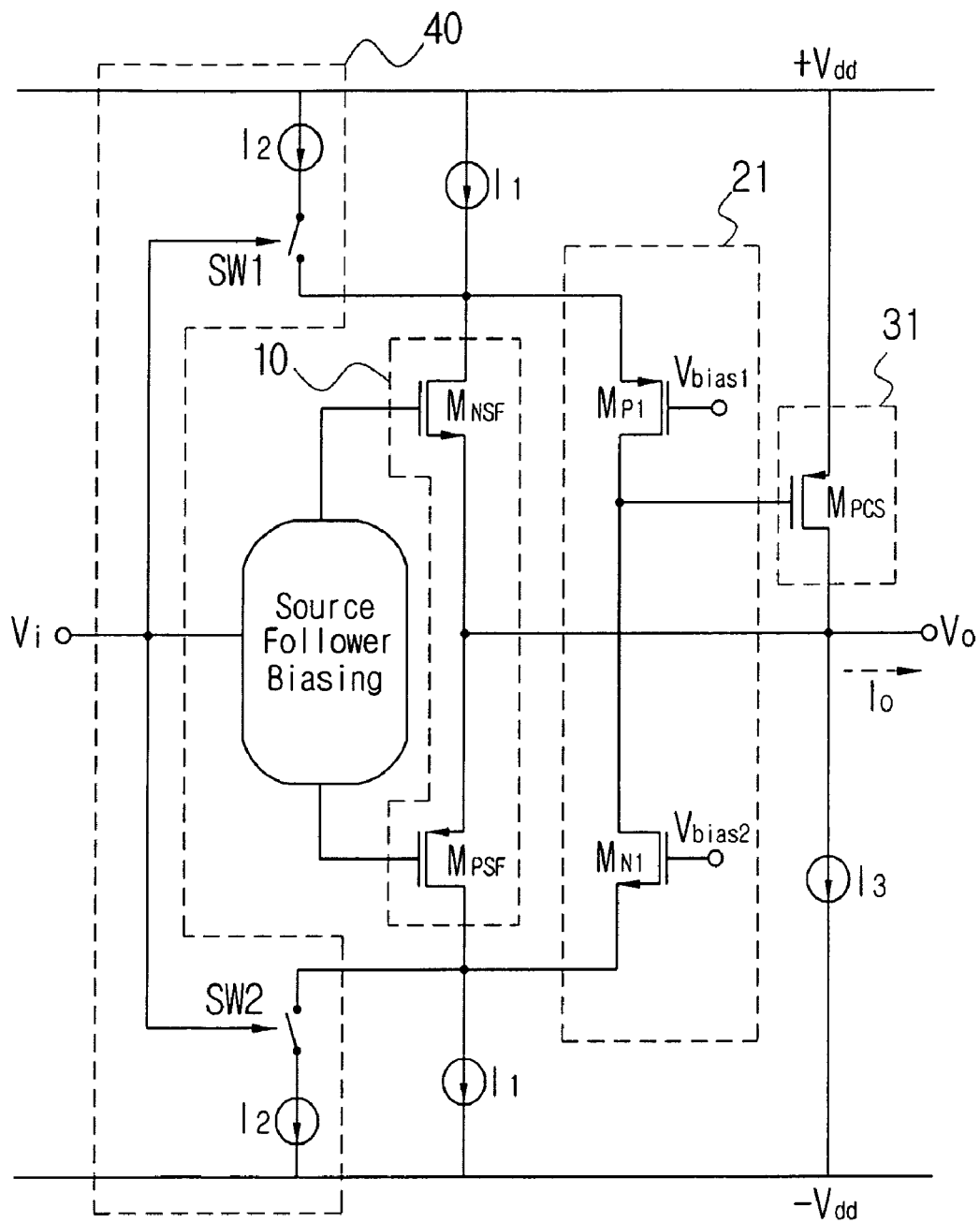
FIG. 10 is a diagram illustrating an output buffer according to a third embodiment of the present invention.

FIG. 10 is a diagram illustrating an output buffer according to a third embodiment of the present invention. Referring to FIG. 10, the output buffer according to the third embodiment includes a push-pull circuit unit 10, an output unit 31, a driver 21, and a rail-to-rail controller 40.

The push-pull circuit unit 10 includes transistors connected to each others in a push-pull formation between a high level power voltage +$V_{dd}$ and a low level power voltage −$V_{dd}$. In more detail, the push-pull circuit unit 10 may include a NMOS source follower $M_{NSF}$ connected to a current source of the high level power voltage +$V_{dd}$ side and a NMOS source follower $M_{PSF}$ connected to a current source of the low level power voltage −$V_{dd}$ side. The push-pull circuit unit 10 has low output impedance due to the NMOS source follower $M_{NSF}$ and the PMOS source follower $M_{PSF}$ connected in a push-pull formation.

The output unit 31 is connected between the high level power voltage +$V_{dd}$ and the low level power voltage −$V_{dd}$. In more detail, the output unit 31 may be a PMOS common source $M_{PCS}$ having a source connected to the high level power voltage +$V_{dd}$ and a drain connected to an output node.

The output unit 31 widens a swing range of an output voltage $V_o$ and supplies most of an output electric current $I_o$.

The driver 21 drives the output unit 31 according to a signal from the push-pull circuit unit 10. The driver 22 includes a PMOS common gate MP1 having a source connected to a drain of the NMOS source follower $M_{NSF}$ and a NMOS common gate $M_{N1}$ having a drain connected to a drain of the PMOS common gate $M_{P1}$ and a source connected to a drain of the PMOS source follower $M_{PSF}$.

The rail-t-rail controller 40 controls ON-OFF states of transistors included in the push-pull circuit unit 10 according to the input voltage $V_i$ of the buffer, thereby widening the swing range of the output voltage $V_o$. The rail-to-rail controller 40 includes a first switch SW1 for controlling ON-OFF of the NMOS source follower $M_{NSF}$ and a second switch SW2 for controlling ON-OFF of the NMOS source follower $M_{PSF}$.

Hereinafter, the operations of the rail-to-rail controller 40 according to the input voltage $V_i$ of the buffer will be described. 1) When an input voltage $V_i$ is a middle level, a first negative feedback loop is formed with the NMOS source follower $M_{NSF}$, the PMOS common gate $M_{P1}$, and the PMOS common source $M_{PCS}$ by turning on the first switch SW1 and a second negative feedback loop is formed with the PMOS source follower $M_{PSF}$, the NMOS common gate $M_{N1}$, and the PMOS common source $M_{PCS}$, by turning on the second switch SW2. That is, when the input voltage $V_i$ is an middle level, the first and second switches are turned on thereby supplying an electric current I2 to the NMOS source follower $M_{NSF}$ and the PMOS source follower $M_{PSF}$. Accordingly, two negative feedback loops $M_{NSF}$–$M_{P1}$–$M_{PCS}$, $M_{PSF}$–$M_{N1}$–$M_{PCS}$ are formed and the output electric current is supplied thereby. 2) When an input voltage $V_i$ is high level, the first switch SW1 is turned off, thereby only forming the second negative feedback loop with the PMOS source follower $M_{PSF}$, the NMOS common gate $M_{N1}$, and the PMOS common source $M_{PCS}$. That is, when the input voltage $V_i$ is a positive high level, the first switch SW1 is turned off thereby interrupting the supplement of the electric current I2. Therefore, the NMOS source follower $M_{NSF}$ is turned off and the first negative feedback loop is disconnected by the NMOS source follower $M_{NSF}$. Only the second negative feedback loop is formed with the PMOS source follower $M_{PSF}$, the NMOS common gate $M_{N1}$, and the PMOS common source $M_{PCS}$. The second negative feedback loop $M_{PSF}$–$M_{N1}$–$M_{PCS}$ supplies an output current and sustains low output impedance. Since the NMOS source follower $M_{NSF}$ disturbing a positive output voltage swing is turned off, it is possible to obtain a sufficient positive output voltage range. 3) when an input voltage $V_i$ is a low level, the second switch SW2 is turned off and the first negative feedback loop is formed with the NMOS source follower $M_{NSF}$, the PMOS common gate $M_{P1}$, and the PMOS common source $M_{PCS}$. That is, when the input voltage $V_i$ is a negative low level, the second switch SW2 is turned off and the supplement of an electric current I2 is interrupted. Accordingly, the second negative loop is disconnected by the PMOS source follower $M_{PSF}$ because the PMOS source follower $M_{PSF}$ is turned off. The first negative feedback loop formed of the NMOS source follower $M_{NSF}$, the PMOS common gate $M_{P1}$, and the PMOS common source $M_{PCS}$ supplies an output current and sustains low output impedance. Since the PMOS source follower $M_{PSF}$ disturbing a negative output voltage swing is turned off, it is possible to obtain sufficient negative output voltage range.

As described above, the output buffer according to the third embodiment can supply a large output electric current in a wide output voltage swing range with low output impedance sustained even in a high frequency band because the output buffer according to the third embodiment keeps at least one negative feedback loops formed even for any output voltages.

Figure 11:
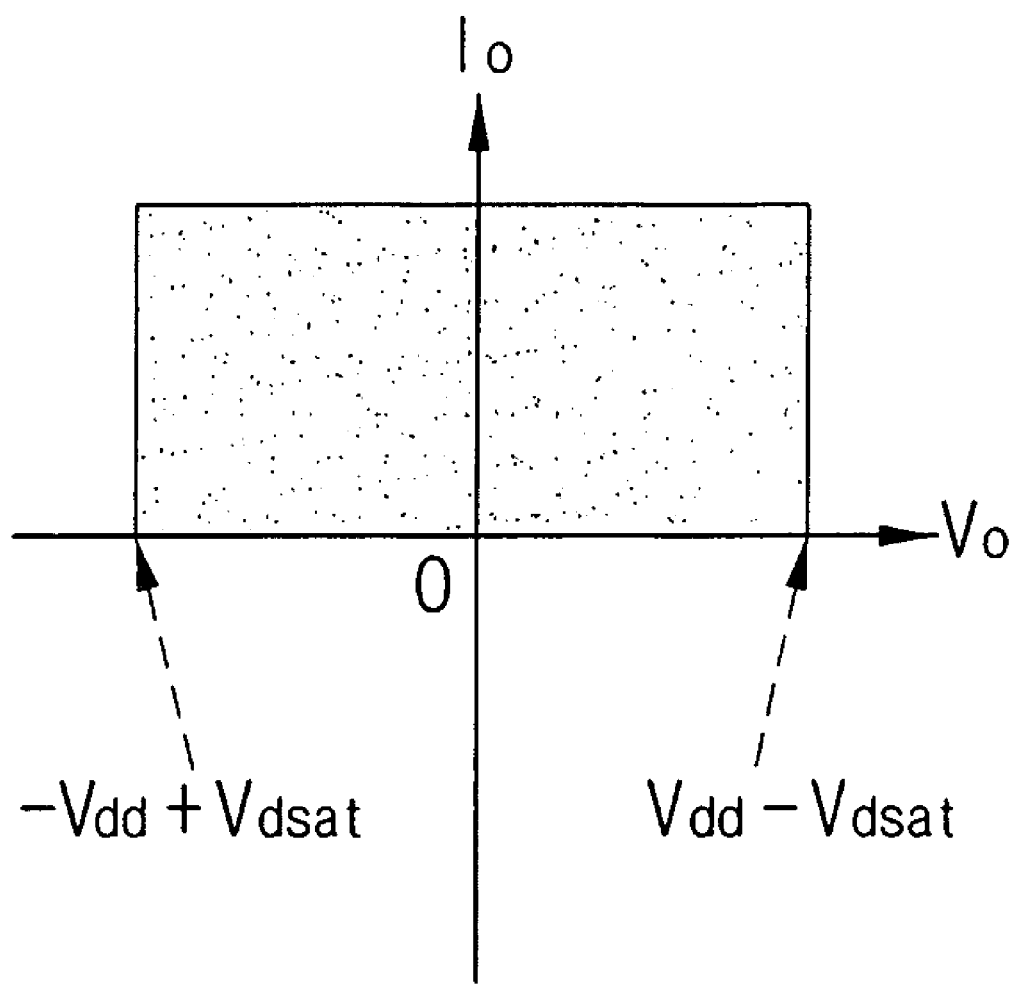
FIG. 11 is a graph illustrating an operating zone of an output electric current $I_o$ for an output voltage $V_o$ in an output buffer according to the third embodiment shown in FIG. 10.

FIG. 11 is a graph illustrating an operating zone of an output electric current $I_o$ for an output voltage $V_o$ in an output buffer according to the third embodiment shown in FIG. 10. Referring to FIG. 11, the graph clearly shows that the output buffer according to the third embodiment can supply an output electric current for any output voltage in a first section and a second section of a quadrant. That is, the output buffer according to the third embodiment operates in two complete sections of a quadrant.

Figure 12:
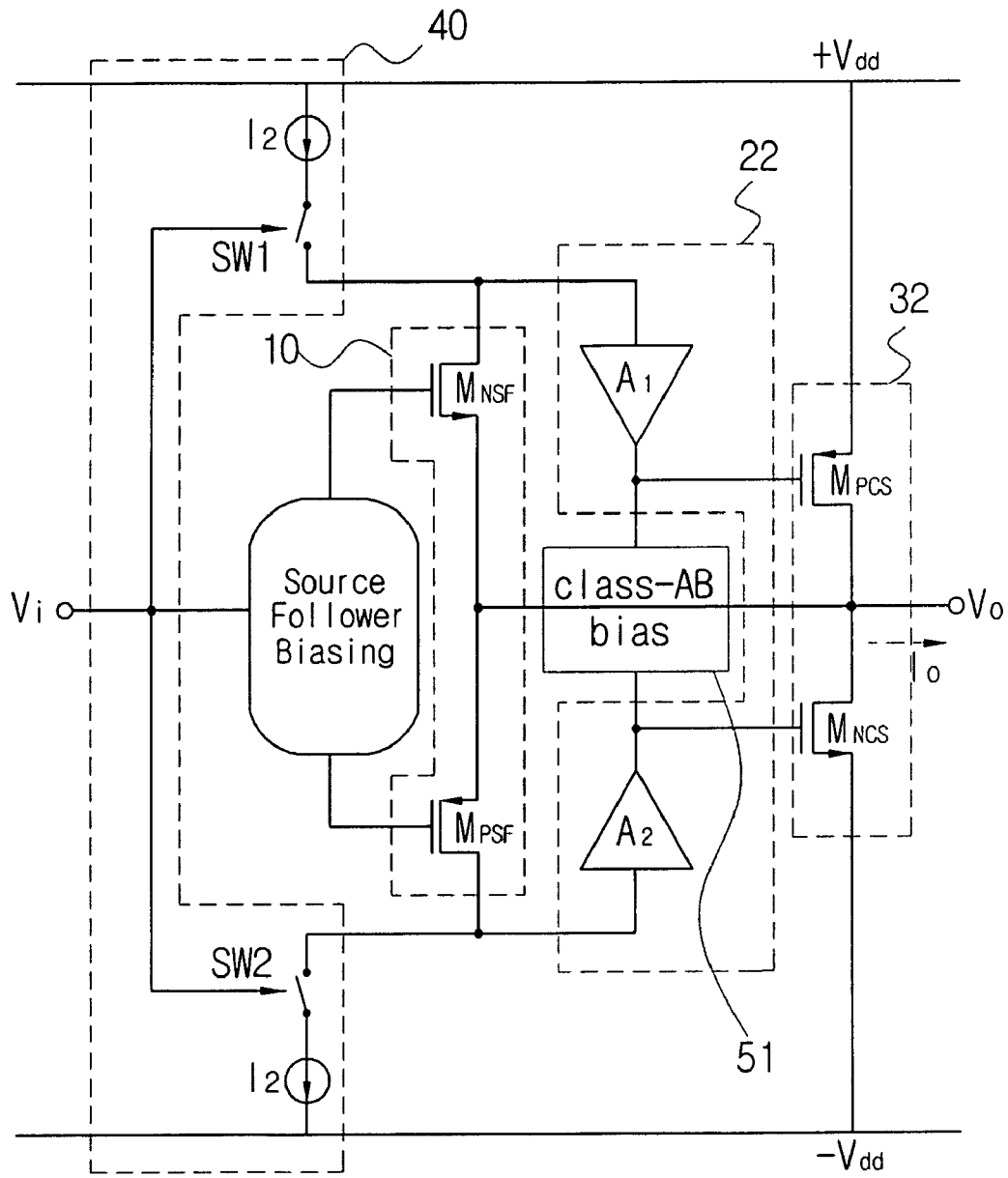
FIG. 12 is a diagram illustrating an output buffer according to a fourth embodiment of the present invention.
Figure 13:
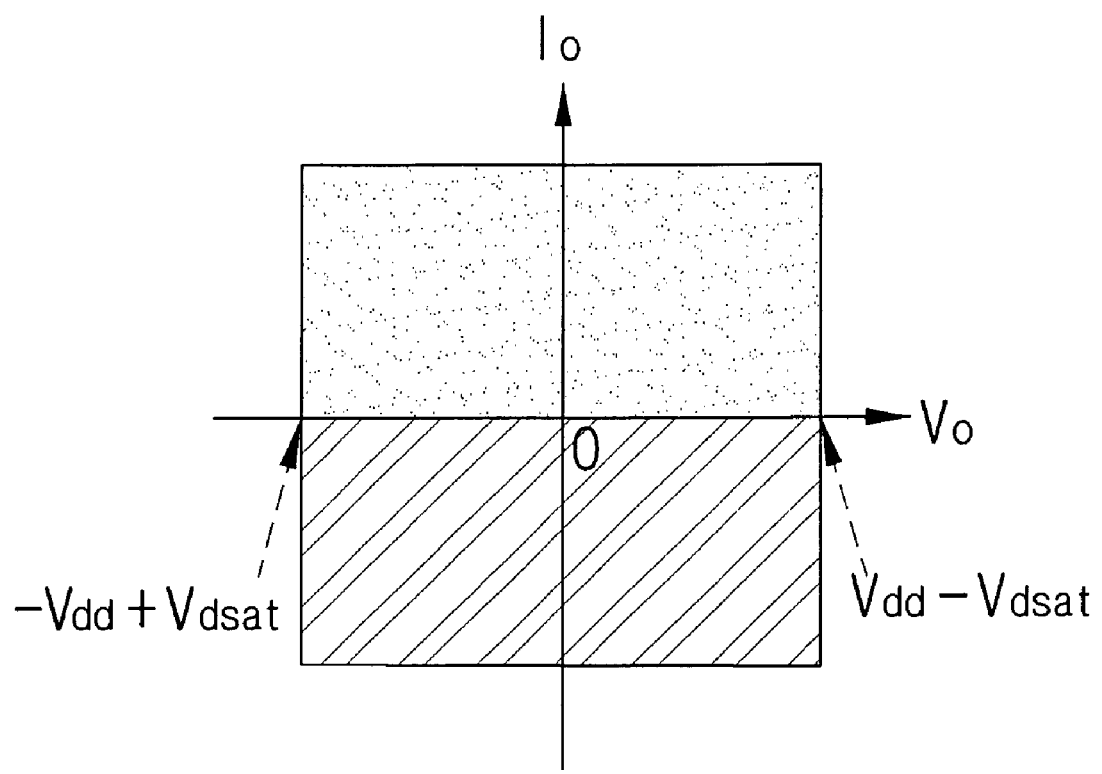
FIG. 13 is a graph illustrating an operating zone of an output electric current $I_o$ for an output voltage $V_o$ in an output buffer according to the fourth embodiment shown in FIG. 12.

FIG. 12 is a diagram illustrating an output buffer according to a fourth embodiment of the present invention. Referring to FIG. 12, the output buffer according to the fourth embodiment includes a push-pull circuit unit 10, an output unit 32, an output bias unit 51, a driver 22, and a rail-to-rail controller 40.

The push-pull circuit unit 10 includes transistors connected to each others in a push-pull formation between a high level power voltage $+V_{dd}$ and a low level power voltage $-V_{dd}$. In detail, the push-pull circuit unit 10 may include a NMOS source follower $M_{NSF}$ connected to an electric current source of a high level power voltage $+V_{dd}$ side and a PMOS source follower $M_{PSF}$ connected to an electric current source of a low level power voltage $-V_{dd}$ side. The push-pull circuit unit 10 has low output impedance because of the NMOS source follower $M_{NSF}$ and the PMOS source follower $M_{PSF}$ connected in the push-pull formation.

The output unit 32 is connected between the high level power voltage $+V_{dd}$ and the low level power voltage $-V_{dd}$. In detail, the output unit 32 may include a PMOS common source $M_{PCS}$ having a source connected to the high level power voltage $+V_{dd}$ and a drain connected to an output node and a NMOS common source $M_{NCS}$ having a drain connected to an output node. The output unit 32 widens a swing range of an output voltage $V_o$ and supplies most of an output electric current $I_o$. The output unit 32 enables the output buffer according to the fourth embodiment to efficiently supply and absorb an output electric current $I_o$. That is, the PMOS common source $M_{PCS}$ and the NMOS common source $M_{NCS}$ make the output buffer to operate in quadrant. In the concrete, the output buffer according to the fourth embodiment can efficiently supply and absorb an output electric current $I_o$ by a first negative feedback loop composed of an NMOS source follower $M_{NSF}$, a first amplifier A1, and a PMOS common source $M_{PCS}$, a second negative feedback loop composed of a PMOS source follower $M_{PSF}$, a second amplifier A2, and a PMOS common source $M_{PCS}$, a third negative feedback loop composed of a NMOS source follower $M_{NSF}$, a first amplifier A1, and a NMOS common source $M_{NCS}$, and a fourth negative feedback loop composed of a PMOS source follower $M_{PSF}$, a second amplifier A2, and an NMOS common source $M_{NCS}$.

The driver 22 drives the output unit 32 according to a signal from the push-pull circuit unit 10. The driver 22 may include a first amplifier A1 having an input connected to a drain of a NMOS source follower $M_{NSF}$ and an output unit commonly connected to an output bias unit 51 and a gate of a PMOS common source $M_{PCS}$, and a second amplifier A2 having an output commonly connected to an output bias unit 51 and a gate of a NMOS common source $M_{NCS}$ and an input connected to a drain of a PMOS source follower $M_{PSF}$.

The rail-to-rail controller 40 widens a swing range of an output voltage $V_o$ by controlling ON-OFF of transistors included in the push-pull circuit unit 10 according to an input voltage $V_i$ of a buffer. The rail-to-rail controller 40 may include a first switch SW1 for controlling ON-OFF of a NMOS source follower $M_{NSF}$ and a second switch SW2 for controlling ON-OFF of a PMOS source follower $M_{PSF}$.

Hereinafter, operations of the rail-to-rail controller 40 according to the input voltage $V_i$ will be described. 1) When the input voltage $V_i$ is a middle level, the first switch SW1 is turned on, thereby forming a first negative feedback loop with the NMOS source follower $M_{NSF}$, the first amplifier, and the PMOS common source $M_{PCS}$, and forming a third negative feedback loop with the NMOS source follower $M_{NSF}$, the first amplifier A1, and the NMOS common source $M_{NCS}$. Also, the middle level input voltage $V_i$ turns on the second switch SW2, thereby forming a second negative feedback loop with the PMOS source follower $M_{PSF}$, the second amplifier A2, and the PMOS common source $M_{PCS}$ and forming a fourth negative feedback loop with the PMOS source follower $M_{PSF}$, the second amplifier A2, and the NMOS common source $M_{NCS}$. That is, if the input voltage $V_i$ is the middle level, an electric current I2 is supplied to the NMOS source follower $M_{NSF}$, the PMOS source follower $M_{PSF}$, the first amplifier A1, and the second amplifier A2 through the turned on first and second switches SW1 and SW2. Accordingly, four negative feedback loops $M_{NSF}$–A1–$M_{PCS}$, $M_{PSF}$–A2–$M_{PCS}$, $M_{NSF}$–A1–$M_{NCS}$, $M_{PSF}$–A2–$M_{NCS}$ are formed, and the formed four negative feedback loops enables the output buffer according to the present embodiment to supply and absorb an output electric current with low output impedance sustained. 2) When an input voltage $V_i$ is a high level, the first switch SW1 is turned off, thereby forming the second negative feedback loop $M_{PSF}$–A2–$M_{PCS}$ and the fourth negative feedback loop $M_{PSF}$–A2–$M_{NCS}$. That is, if the input voltage $V_i$ is a positive (+) high level, the first switch SW1 is turned off, thereby interrupting the supplement of the electric current I2. Accordingly, the NMOS source follower $M_{NSF}$ is turned off. Because of the turned off NMOS source follower $M_{NSF}$, the first and third negative feedback loops $M_{NSF}$–A1–$M_{PCS}$ and $M_{NSF}$–A1–$M_{NCS}$ are disconnected. Also, the PMOS source follower $M_{PSF}$ enables the second and fourth negative feedback loops $M_{PSF}$–A2–$M_{PCS}$ and $M_{PSF}$–A2–$M_{NCS}$ to supply and absorb an output electric current with low output impedance sustained. Since the NMOS source follower $M_{NSF}$ that disturbs the swing of a positive output voltage is turned off, a positive (+) output voltage range can be sufficiently obtained. 3) When the input voltage $V_i$ is a low level, the second switch SW2 is turned off, thereby forming the first and third negative feedback loops $M_{NSF}$–A1–$M_{PCS}$ and $M_{NSF}$–A1–$M_{NCS}$. That is, if the input voltage $V_i$ is a negative (−) low level, the second switch SW2 is turned off, thereby interrupting the supplement of the electric current I2. Accordingly, the PMOS source follower $M_{PSF}$ is turned off. Therefore, the turned off PMOS source follower $M_{PSF}$ disconnects the second and fourth negative feedback loops $M_{PSF}$–A2–$M_{PCS}$ and $M_{PSF}$–A2–$M_{NCS}$, and the NMOS source follower $M_{NSF}$ enables the first and third negative feedback loops $M_{NSF}$–A1–$M_{PCS}$ and $M_{NSF}$–A1–$M_{NCS}$ to supply and absorb an output electric current with low output impedance sustained. Since the PMOS source follower $M_{PSF}$ that disturbs the swing of a negative output voltage is turned off, a negative (−) output voltage range can be obtained sufficiently.

In the output buffer according to the fourth embodiment, the output unit 32 is connected to the PMOS common source $M_{PCS}$ and the NMOS common source $M_{NCS}$ in the push-pull structure to enable both of supplying and absorbing an output electric current. Therefore, the output buffer according to the fourth embodiment further includes the output bias unit 51 for controlling a bias electric current of the PMOS common source $M_{PCS}$ and the NMOS common source $M_{NCS}$.

As described above, the output buffer according to the fourth embodiment can supply and absorb a high output electric current with low output impedance sustained even in a high frequency band because at least two negative feedback loops are kept formed for any output voltages. Therefore, it is possible to obtain an output electric current characteristic for an output voltage that can be operated in all four sections of a quadrant. Unlike typical output buffers, the output buffer according to the present embodiment has a structure close to an ideal buffer design because the output buffer according to the present embodiment can sustain low output impedance at a high frequency, be operable in four sections of a quadrant, have a wide output voltage range, and have a large output electric current driving capability.

Figure 14:
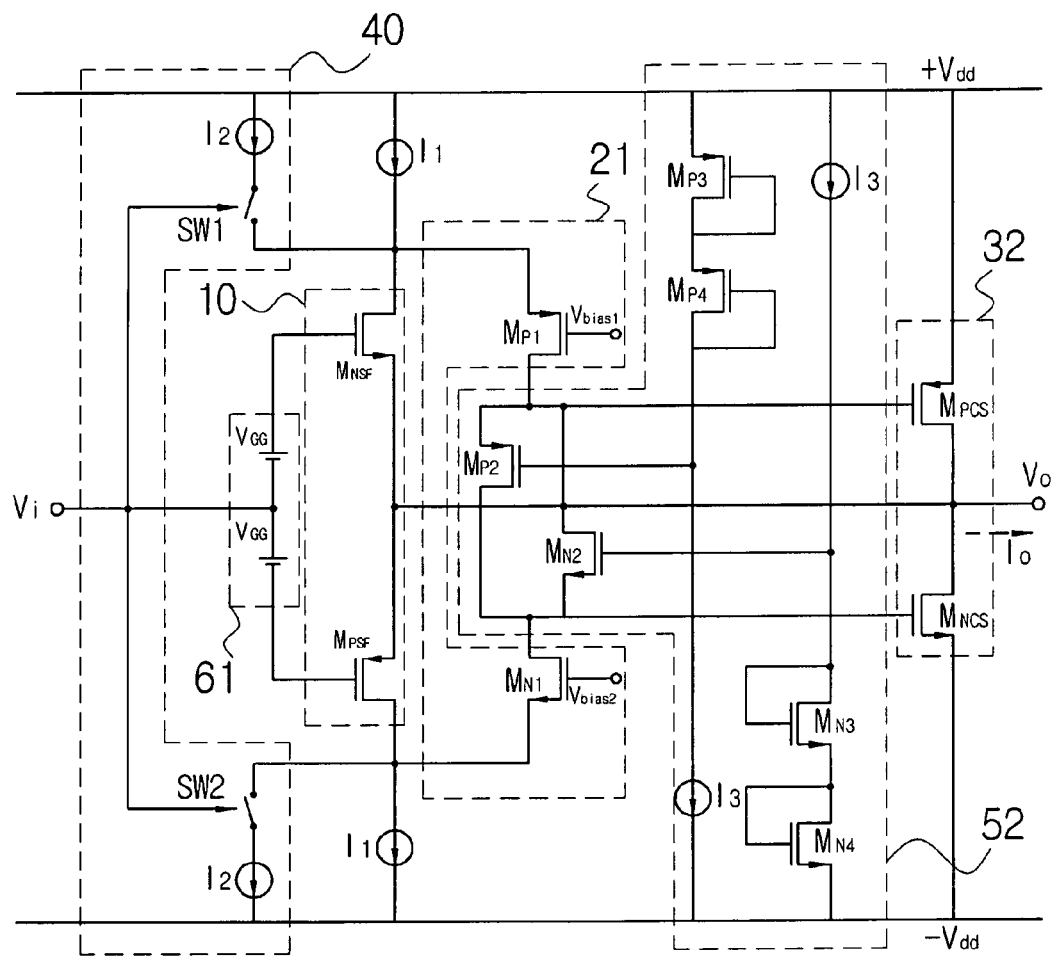
FIG. 14 is a diagram illustrating an output buffer according to a fifth embodiment of the present invention.

FIG. 14 is a diagram illustrating an output buffer according to a fifth embodiment of the present invention. Referring to FIG. 14, the output buffer according to the fifth embodiment includes a push-pull circuit unit 10, an output unit 32, an output bias unit 52, a driver 21, and a rail-to-rail controller 40.

Hereinafter, the output buffer according to the fifth embodiment will be described based on the driver 21 and the output bias unit 52, which are the main features thereof, by comparing with the output buffer according to the fourth embodiment.

The driver 21 may includes a first PMOS field effect transistor $M_{P1}$ having a source connected to a drain of a NMOS source follower $M_{NSF}$ and a drain connected to the output bias unit 52 in a common gate form and a first NMOS field effect transistor $M_{N1}$ having a drain connected to the output bias unit 52 and a source connected to a drain of a PMOS source follower $M_{PSF}$ in a common gate form.

The output bias unit 52 biases the output unit 32 and is a FeedForward Class-AB Bias current control type.

The output bias unit 52 may include a first translinear loop $M_{P3}$–$M_{P4}$–$M_{P2}$–$M_{PCS}$ for biasing a PMOS common source $M_{PCS}$ and a second translinear loop $M_{N3}$–$M_{N4}$–$M_{N2}$–$M_{NCS}$ for biasing a NMOS common source $M_{NCS}$.

DC bias electric currents of a PMOS common source $M_{PCS}$ and a NMOS common source $M_{NCS}$ of the output unit 32 are decided by the first and second translinear loops $M_{P3}$–$M_{P4}$–$M_{P2}$–$M_{PCS}$ and $M_{N3}$–$M_{N4}$–$M_{N2}$–$M_{NCS}$. Accordingly, a minimum electric current is guaranteed not to turn off a NMOS common source $M_{NCS}$ while supplying an output electric current and not to turn off a PMOS common source $M_{PCS}$ while absorbing an output electric current.

As compared with a Feedback Class-AB Bias current control type that control a DC bias electric current and a minimum electric current by sensing an electric current of a PMOS common source $M_{PCS}$ and a NMOS common source $M_{NCS}$, the output bias unit 52 in the output buffer according to the fifth embodiment is a FeedForward Class-AB Bias current control type.

Meanwhile, a source follower biasing block 61 is embodied as a voltage source $V_{GG}$ for deciding a bias electric current of a NMOS source follower $M_{NSF}$ and a PMOS source follower $M_{PSF}$ formed in a push-pull structure.

Figure 15:
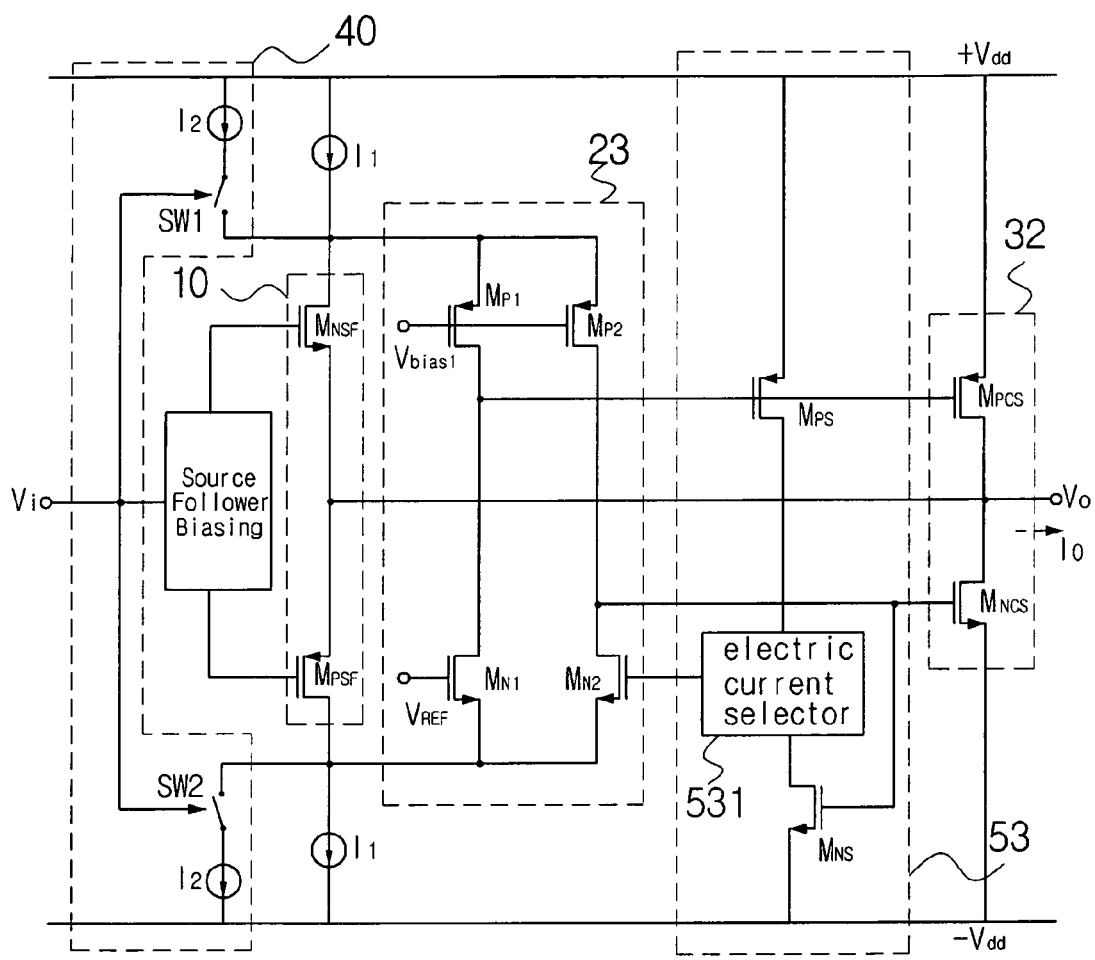
FIG. 15 is a diagram illustrating an output buffer according to a sixth embodiment.

FIG. 15 is a diagram illustrating an output buffer according to a sixth embodiment. Referring to FIG. 15, the output buffer according to the sixth embodiment includes a push-pull circuit unit 10, an output unit 32, an output bias unit 53, a driver 23, and a rail-to-rail controller 40.

Hereinafter, the output buffer according to the sixth embodiment will be described based on the driver 23 and the output bias unit 53, which are the main features thereof, by comparing with the output buffer according to the fourth embodiment.

The driver 23 includes a first PMOS field effect transistor $M_{P1}$, a second PMOS field effect transistor $M_{P2}$, a first NMOS field effect transistor $M_{N1}$, and a second NMOS field effect transistor $M_{N2}$.

The sources of the first and second PMOS field effect transistors $M_{P1}$ and $M_{P2}$ are connected to a drain of a NMOS source follower $M_{NSF}$, and a first bias voltage $V_{bias1}$ is supplied to gates of the first and second PMOS field effect transistors $M_{P1}$ and $M_{P2}$. A drain of the first PMOS field effect transistor $M_{P1}$ is connected to a drain of the first NMOS field effect transistor $M_{N1}$, and a drain of the second PMOS field effect transistor $M_{P2}$ is connected to a drain of the second NMOS field effect transistor $M_{N2}$. Sources of the first and second NMOS field effect transistors $M_{N1}$ and $M_{N2}$ are connected to a drain of the PMOS source follower $M_{PSF}$, a reference voltage $V_{REF}$ is supplied to a gate of the first NMOS field effect transistor $M_{N1}$, and a gate of the second NMOS field effect transistor $M_{N2}$ is connected to the output bias unit 53.

The output bias unit 53 may include a third PMOS field effect transistor $M_{PS}$ for detecting a electric current of a PMOS common source $M_{PCS}$, a third NMOS field effect transistor $M_{NS}$ for detecting a electric current of a NMOS common source $M_{NCS}$, and an electric current selector 531 for supplying a voltage to a gate of the second NMOS field effect transistor $M_{N2}$ according to a smaller one of the electric current of the third NMOS field effect transistor $M_{NS}$ and the electric current of the third PMOS field effect transistor $M_{PS}$.

A source of a third PMOS field effect transistor $M_{PS}$ is connected to a source of the PMOS common source $M_{PCS}$, and a gate of the third PMOS field effect transistor $M_{PS}$ is connected to a gate of the PMOS common source $M_{PCS}$ and a drain of the first NMOS field effect transistor $M_{N1}$. A drain of the third PMOS field effect transistor $M_{PS}$ is connected to the electric current selector 531, and a source of the third NMOS field effect transistor $M_{NS}$ is connected to a source of the NMOS common source $M_{NS}$. A gate of the third NMOS field effect transistor $M_{NS}$ is connected to a gate of the NMOS common source $M_{NCS}$ and a drain of the second NMOS field effect transistor $M_{N2}$, and a drain of the third NMOS field effect transistor $M_{NS}$ is connected to the electric current selector 531.

Hereinafter, the operation of the output bias unit 53 included in the output buffer according to the sixth embodiment shown in FIG. 15 will be described.

For class-AB bias current control, the output bias unit 53 1) detects electric currents of the PMOS common source $M_{PCS}$ and the NMOS common source $M_{NCS}$ included in the output unit 32, 2) selects a smaller electric current from the detected two electric currents using the electric current selector 531, and 3) controls a DC bias electric current and a minimum electric current of the PMOS common source $M_{PCS}$ and the NMOS common source $M_{NCS}$ included in the output unit 32 by transforming the selected minimum current to a voltage and comparing the voltage with a reference voltage $V_{REF}$ supplied to a gate of the first NMOS transistor $M_{N1}$.

In order to obtain electric currents in proportion to the main electric currents, it is preferable to design the third PMOS transistor $M_{PS}$ to have a narrower channel width than that of the PMOS common source $M_{PCS}$ by reducing a channel width at a predetermined rate and to design the third NMOS transistor $M_{NS}$ to have a narrower channel width than that of the NMOS common source $M_{NCS}$ by reducing a channel width at a predetermined rate.

The electric current selector 531 selects a smaller electric current from electric currents detected by the third PMOS transistor $M_{PS}$ and the third NMOS transistor $M_{NS}$, and a differential signal is generated to control gates of the PMOS common source $M_{PCS}$ and the NMOS common source $M_{NCS}$ in order that a voltage obtained from the selected electric current may be equal to a reference voltage $V_{REF}$ by a negative feedback loop. In order to individually control gates of the third PMOS transistor $M_{PS}$ and the third NMOS transistors $M_{NS}$ using the differential signal, the driver 23 forms a first path composed of the first NMOS field effect transistor $M_{N1}$ and the first PMOS field effect transistor $M_{P1}$ and a second path composed of the second NMOS field effect transistor $M_{N2}$ and the second PMOS field effect transistor $M_{P2}$, connects a gate of the PMOS common source $M_{PCS}$ to the first path, and connects a gate of the NMOS common source $M_{PCS}$ to the second path. When one of the PMOS common source $M_{PCS}$ and the NMOS common source $M_{NCS}$ drives a load, the other supplies a preset minimum electric current using the output bias unit 53 without being turned off. Since the PMOS common source $M_{PCS}$ and the NMOS common source $M_{NCS}$ are not turned off, it is possible to reduce distortion that is formed by delay of turning back on after being turned off.

Figure 16:
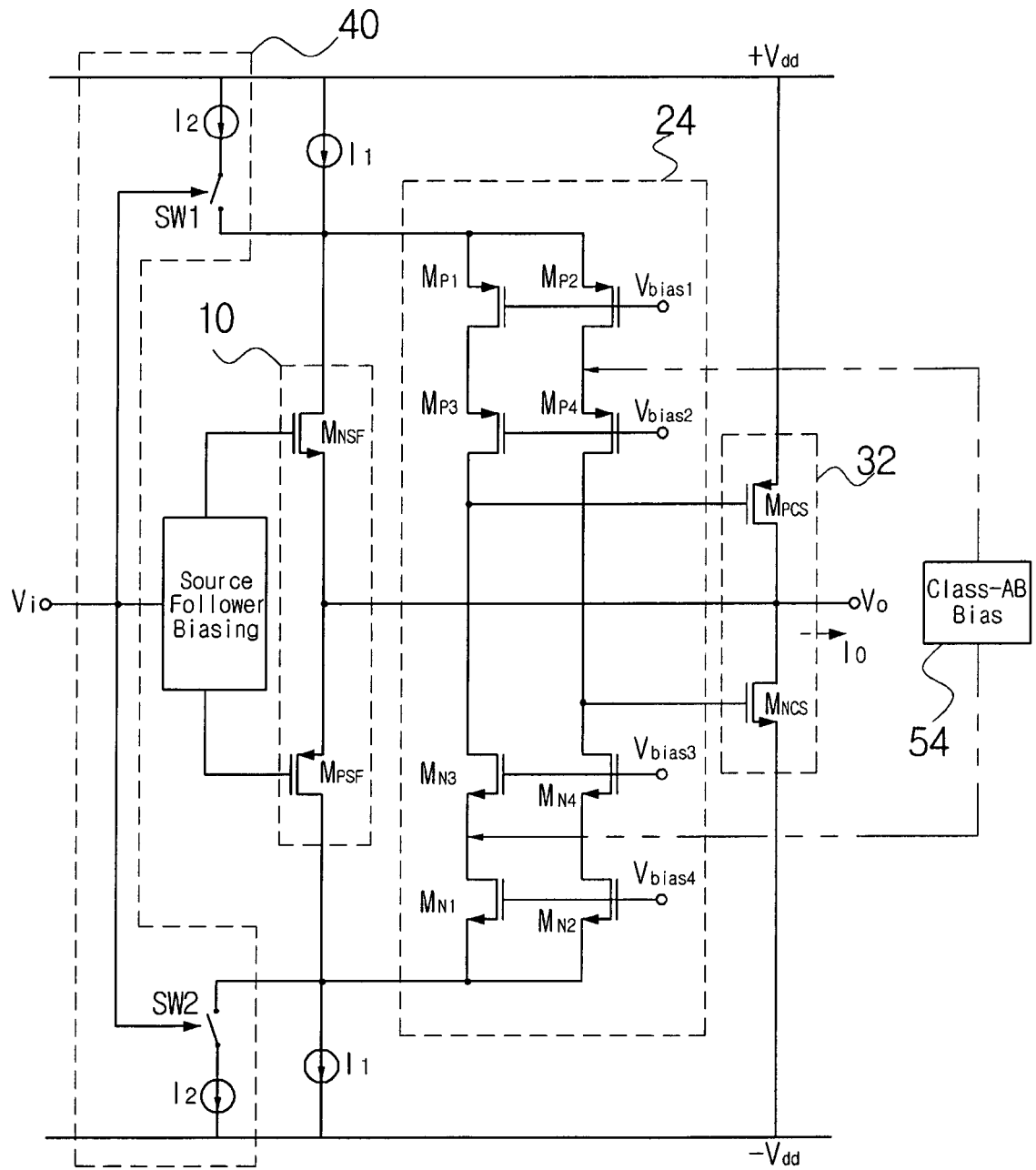
FIG. 16 is a diagram illustrating an output buffer according to a seventh embodiment of the present invention.

FIG. 16 is a diagram illustrating an output buffer according to a seventh embodiment of the present invention.

Hereinafter, the output buffer according to the seventh embodiment will be described based on a driver 24, which is a major feature thereof, by comparing with the output buffer according to the sixth embodiment with reference to FIG. 16.

Unlike the output buffer according to the sixth embodiment that generates a control signal by transforming a selected minimum electric current to a voltage and comparing the voltage with a reference voltage, the output buffer according to the seventh embodiment generates control signals for controlling gates of a PMOS common source $M_{PCS}$ and a NMOS common source $M_{NCS}$ by directly comparing a selected minimum electric current with a reference current without transforming the selected minimum electric current to a voltage.

Referring to FIG. 16, the output buffer according to the seventh embodiment further includes cascode transistors formed of a third PMOS field effect transistor $M_{P3}$, a fourth PMOS field effect transistor $M_{P4}$, a third NMOS field effect transistor $M_{N3}$, and a fourth NMOS field effect transistor $M_{N4}$ as compared with the output buffer of FIG. 15.

In more detail, the driver 24 includes first to fourth PMOS field effect transistors $M_{P1}$, $M_{P2}$, $M_{P3}$, and $M_{P4}$, and first to fourth NMOS transistors $M_{N1}$, $M_{N2}$, $M_{N3}$, and $M_{N4}$.

Sources of the first and second PMOS field effect transistors $M_{P1}$ and $M_{P2}$ are connected to a drain of an NMOS source follower $M_{NSF}$, and the third PMOS field effect transistor $M_{P3}$ is cascode-connected to the first PMOS field effect transistor $M_{P1}$. The fourth PMOS field effect transistor $M_{P4}$ is cascode-connected to the second PMOS field effect transistor $M_{P2}$, and the sources of the first and second NMOS field effect transistors $M_{N1}$ and $M_{N2}$ are connected to a drain of a PMOS source follower $M_{PSF}$. The third NMOS field effect transistor $M_{N3}$ is cascode-connected to the first NMOS field effect transistor $M_{N1}$, and the fourth NMOS field effect transistor $M_{N4}$ is cascode-connected to the second NMOS field effect transistor $M_{N2}$. A drain of the third NMOS field effect transistor $M_{N3}$ is connected to a drain of the third PMOS field effect transistor $M_{P3}$, and a drain of the fourth NMOS field effect transistor $M_{N4}$ is connected to a drain of the fourth PMOS field effect transistor $M_{P4}$.

Since the output buffer according to the sixth embodiment shown in FIG. 15 transforms a selected minimum electric current to a voltage and compares the voltage with a reference voltage $V_{REF}$, a pole is formed, which may influence a phase margin at a node for transforming the selected minimum electric current to a voltage, that is a gate node of the transistor $M_{N2}$. On the contrary, the output buffer according to the seventh embodiment of FIG. 16 has an advantage of forming a pole at a high frequency area as much as not influencing a phase margin because gate control electric currents of the PMOS common source $M_{PCS}$ and the NMOS common source $M_{NCS}$ are supplied to source nodes of the cascode transistors.

Figure 17:
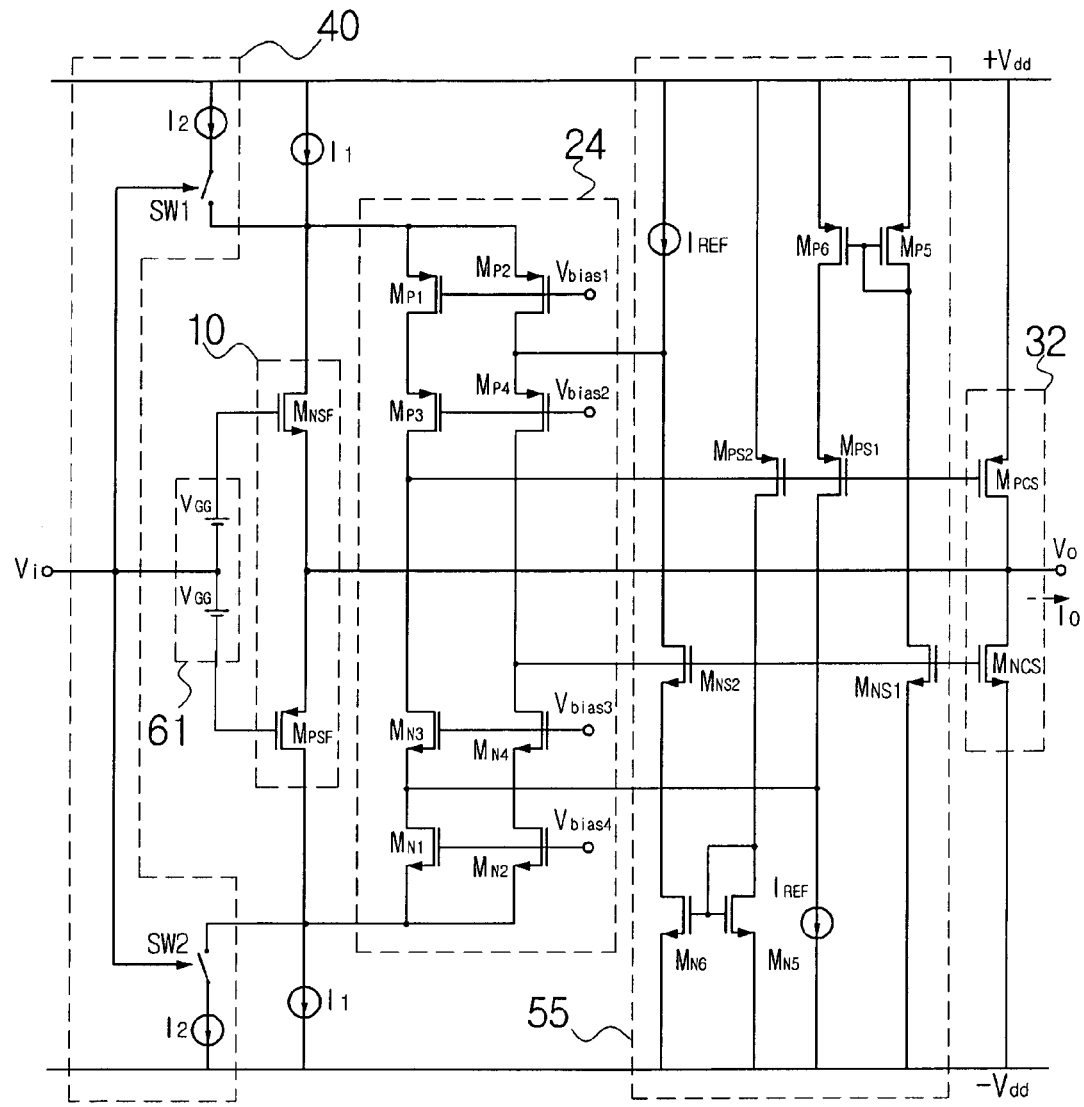
FIG. 17 is a diagram illustrating an output buffer according to an eighth embodiment of the present invention.

FIG. 17 is a diagram illustrating an output buffer according to an eighth embodiment of the present invention.

Hereinafter, the output buffer according to the eighth embodiment will be described based on an output bias unit 55, which is a main feature thereof, by comparing with the output buffer according to the seventh embodiment with reference to FIG. 17.

Referring to FIG. 17, the output bias unit 55 controls gates of a PMOS common source $M_{PCS}$ and a NMOS common source $M_{NCS}$ by comparing a reference current $I_{REF}$ with a smaller electric current between main electric currents of a PMOS common source $M_{PCS}$ and a NMOS common source $M_{NCS}$.

The control operation of the output bias unit 55 will be described in more detail.

1) Two minimum electric current selection circuits $M_{NS1}$-$M_{PS1}$-$M_{P5}$-$M_{P6}$, and $M_{NS2}$-$M_{PS2}$-$M_{N5}$-$M_{N6}$ select a smaller electric current between main electric currents of the PMOS common source $M_{PCS}$ and the NMOS common source $M_{NCS}$. 2) Signals are generated for controlling gates of the PMOS common source $M_{PCS}$ and the NMOS common source $M_{NCS}$ by comparing the selected electric current with a reference electric current $I_{REF}$.

In order to generate a sensed current in proportion to the main electric currents of the PMOS common source $M_{PCS}$ and the NMOS common source $M_{NCS}$, the transistors $M_{PS1}$ and $M_{PS2}$ are designed to have a channel width narrower than that of the PMOS common source $M_{PCS}$ at a predetermined rate, and the transistors $M_{NS1}$ and $M_{NS2}$ are designed to have a channel width narrower than that of the NMOS common source $M_{NCS}$ at a predetermined rate.

Figure 18:
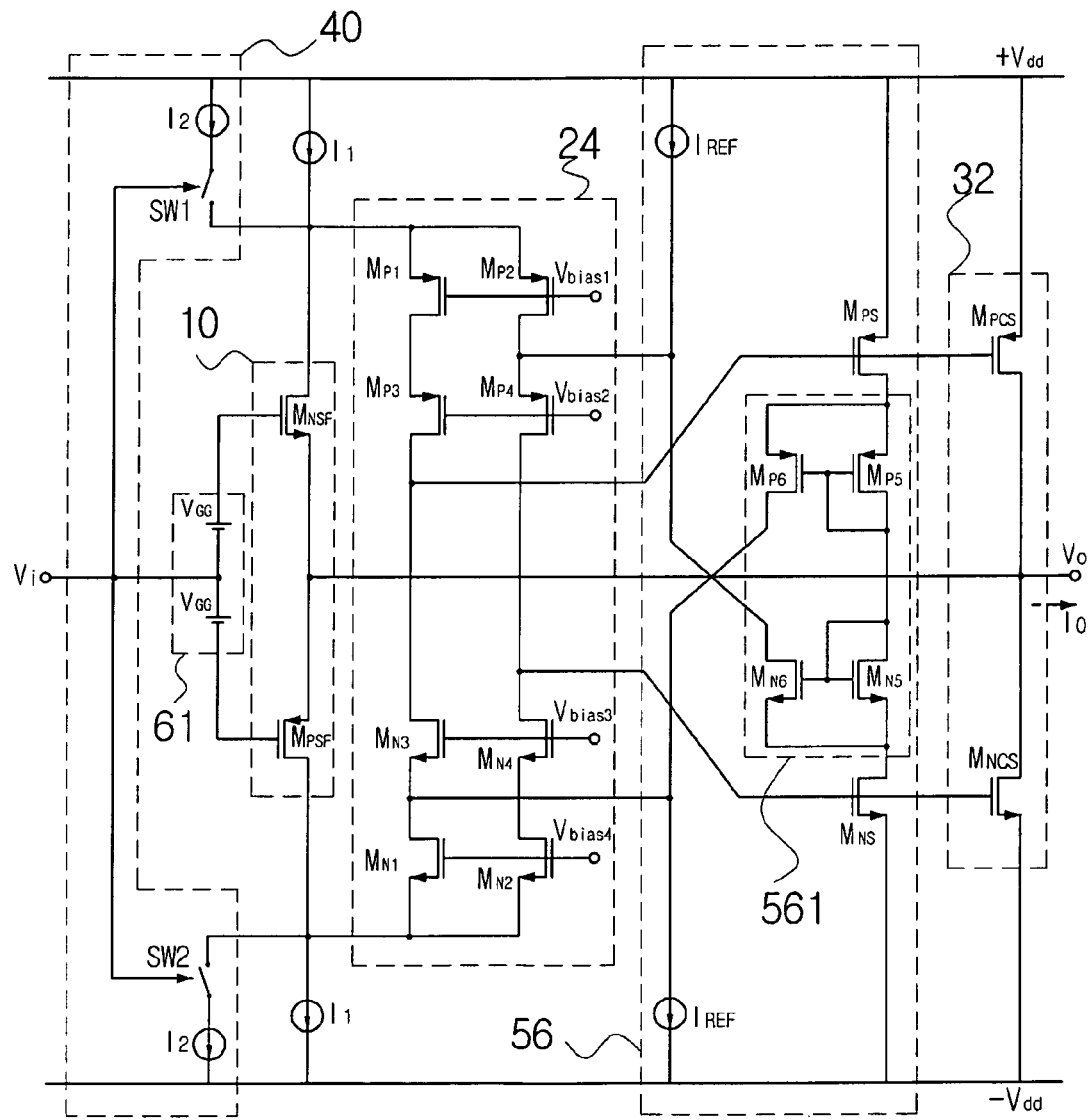
FIG. 18 is a diagram illustrating an output buffer according to a ninth embodiment of the present invention.

FIG. 18 is a diagram illustrating an output buffer according to a ninth embodiment of the present invention. Referring to FIG. 18, the output buffer according to the ninth embodiment includes a push-pull circuit unit 10, an output unit 32, an output bias unit 56, a driver 24, a rail-to-rail controller 40, and a source follower biasing block 61.

Hereinafter, the output buffer according to the ninth embodiment will be described based on the output bias unit 56, which is a major feature thereof, by comparing with the output buffer according to the eighth embodiment.

The output bias unit 56 may include a PMOS sensing transistor $M_{PS}$ for outputting a first sensed current according to a main electric current of a PMOS common source $M_{PCS}$, a NMOS sensing transistor $M_{NS}$ for outputting a second sensed current according to a main electric current of a NMOS common source $M_{NCS}$, and a bias controller 561 for controlling a gate of the PMOS common source $M_{PCS}$ and a gate of the NMOS common source $M_{NCS}$ by comparing a reference current $I_{REF}$ with an electric current obtained by dividing one of the first sensed current and the second sensed current by half through current mirroring.

The operations of the output bias unit 56 will be described hereinafter.

The PMOS sensing transistor $M_{PS}$ senses a main electric current of the PMOS common source $M_{PCS}$ and the NMOS sensing transistor $M_{NS}$ senses a main electric current of the NMOS common source $M_{NCS}$. One of the sensing transistors $M_{PS}$ and $M_{NS}$, which is connected to a common source where a higher electric current of the two main electric currents follows, cannot sense an electric current because it enters a Triode Region. On the contrary, a sensed current from the sensing transistor connected to a common source where a lower electric current of the two main electric currents flows is divided by half through current mirror $M_{N5}$–$M_{N6}$, and $M_{P5}$–$M_{P6}$. Then, the divided current is compared with a reference current $I_{REF}$, thereby generating the control signals.

Such operation will be described in more detail as follows.

1. When a high electric current is supplied by a PMOS common source $M_{PCS}$.

The PMOS sensing transistor $M_{PS}$ enters the Triode Region. Therefore, a high level power voltage +$V_{dd}$ is formed at a drain node of the PMOS sensing transistor $M_{PS}$. A drain electric current of the NMOS sensing transistor $M_{NS}$, which senses the main electric current of the NMOS common source $M_{NCS}$, is divided by half at transistors $M_{N5}$ and $M_{N6}$. A gate of the NMOS common source $M_{NCS}$ is controlled by comparing electric current following to the transistor $M_{N6}$ with a reference current $I_{REF}$ not to turn off the NMOS common source $M_{NCS}$.

2. When the NMOS common source $M_{NCS}$ supplies a large electric current to an output.

The NMOS sensing transistor $M_{NS}$ falls a Triode Region. An electric current sensed by the PMOS sensing transistor $M_{PS}$ is divided by half and the gates of the PMOS common source $M_{PCS}$ and the NMOS common source $M_{NCS}$ are controlled by comparing the divided sensed current with a reference current $I_{REF}$.

The output buffer according to the ninth embodiment of the present invention has an advantage that the output bias unit has a structure simpler than that of the output buffer according to the eighth embodiment of FIG. 17.

According to the ninth embodiment, a sensing transistor connected to a common source driving a high current cannot sense an electric current because the sensing transistor enters a triode region. Therefore, the output buffer according to the ninth embodiment can advantageously reduce unnecessary power consumption to sense an electric current. In more detail, 1) When the PMOS common source $M_{PCS}$ supplies a high electric current to an output node in the output buffer according to the eighth embodiment of FIG. 17, the transistor $M_{N6}$ cannot be operated as a current mirror because the transistor $M_{N6}$ falls into a triode region. Therefore, the electric current sensed by the transistor $M_{PS2}$ is wasted through the transistor $M_{N5}$ without being used for controlling a gate of a common source. Since the wasted electric current increases in proportion to an electric current flowing through the PMOS common source $M_{PCS}$. 2) When the NMOS common source $M_{NCS}$ supplies a large electric current to an output node in the output buffer according to the eight embodiment of FIG. 17, the transistor $M_{P6}$ cannot be operated as a current mirror because the transistor $M_{P6}$ falls into a triode region. Therefore, an electric current sensed by the transistor $M_{NS1}$ is wasted through the transistor $M_{P5}$ without being used for controlling a gate of a common source. 3) Unlikely, in the output buffer according to the ninth embodiment of FIG. 18, a wasted electric current without being used for controlling is not detected at a common source where a large electric current flows in a step of selecting a minimum electric current among electric currents of common sources. Therefore, unnecessary power consumption can be reduced. If a channel width ratio of a common source and a sensing transistor sensing an electric current of the common source is N:1, a Quiescent bias current that flows to the common source without an input signal becomes 2N*$I_{REF}$. When an input signal is applied, a minimum electric current guaranteed at the common source is decided as 2N*$I_{REF}$.

Figure 19:
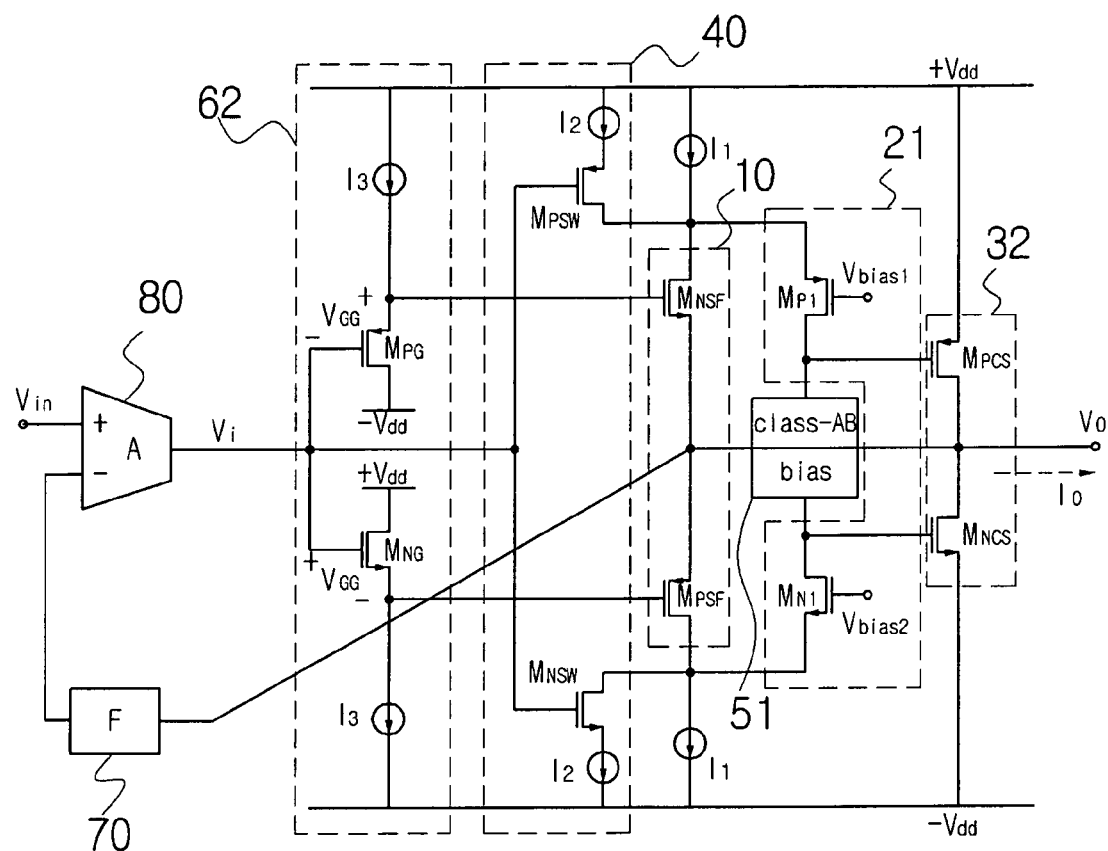
FIG. 19 is a diagram illustrating a power amplifier according to a first embodiment of the present invention.

FIG. 19 is a diagram illustrating a power amplifier according to a first embodiment of the present invention. Referring to FIG. 19, the power amplifier according to the first embodiment a push-pull circuit unit 10 having transistors connected to each others in a push-pull formation between a high level power voltage +$V_{dd}$ and a low level power voltage –$V_{dd}$, an output unit 32 having common sources connected between the high level power voltage +$V_{dd}$ and the low level power voltage –$V_{dd}$, an output bias unit 51 for biasing the output unit 32, a driver 21 for driving the output unit 32 according to a signal from the push-pull circuit unit 10, a rail-to-rail controller 40 for widening a swing range of an output voltage Vo by controlling ON-OFF of the transistors included in the push-pull circuit unit 10 according to an input voltage $V_i$ of the output buffer, a feedback unit 70 for feedbacking the output voltage $V_o$ to an input side, and an amplifier 80 for amplifying a difference between an input voltage $V_{in}$ and the feedbacked output voltage $V_o$.

The power amplifier according to the first embodiment of the present invention includes constituent elements identical to those of the output buffer according to the embodiments of the present invention, which were already described. Therefore, the descriptions of the identical constituent elements are omitted.

The power amplifier according to the first embodiment shown in FIG. 19 is an example of embodying an amplifier having low output impedance using the feedback unit 70 and the amplifier 80 with the output unit 32, the driver 21, and the rail-to-rail controller 40, which are included the output buffer according to the fifth embodiment of FIG. 14. In order to embody the source follower biasing block 62 for defining a bias electric current of source followers $M_{NSF}$ and $M_{PSF}$ having in a push-pull formation, source followers composed of $M_{PG}$–$I_3$ and $M_{NG}$–$I_3$ are used. An amplifier having low output impedance can be embodied in various ways using the output buffers according to the embodiments of the present invention. The power amplifier according to the first embodiment shown in FIG. 19 is one of examples thereof. Referring to FIG. 19, when the amplifier 80 is used for supplying a large electric power to an output node, a power amplifier can be embodied by forming an open-loop amplifier through connecting an output buffer including the push-pull circuit unit 10, the output unit 32, the output bias unit 51, the driver 21, and the rail-to-rail controller 40 to the amplifier 80 in series and forming a closed-loop through forming a negative feedback loop around the open-loop amplifier. For example, a negative feedback can be formed by applying voltage-series negative feedback using the feedback unit 70.

Figure 20:
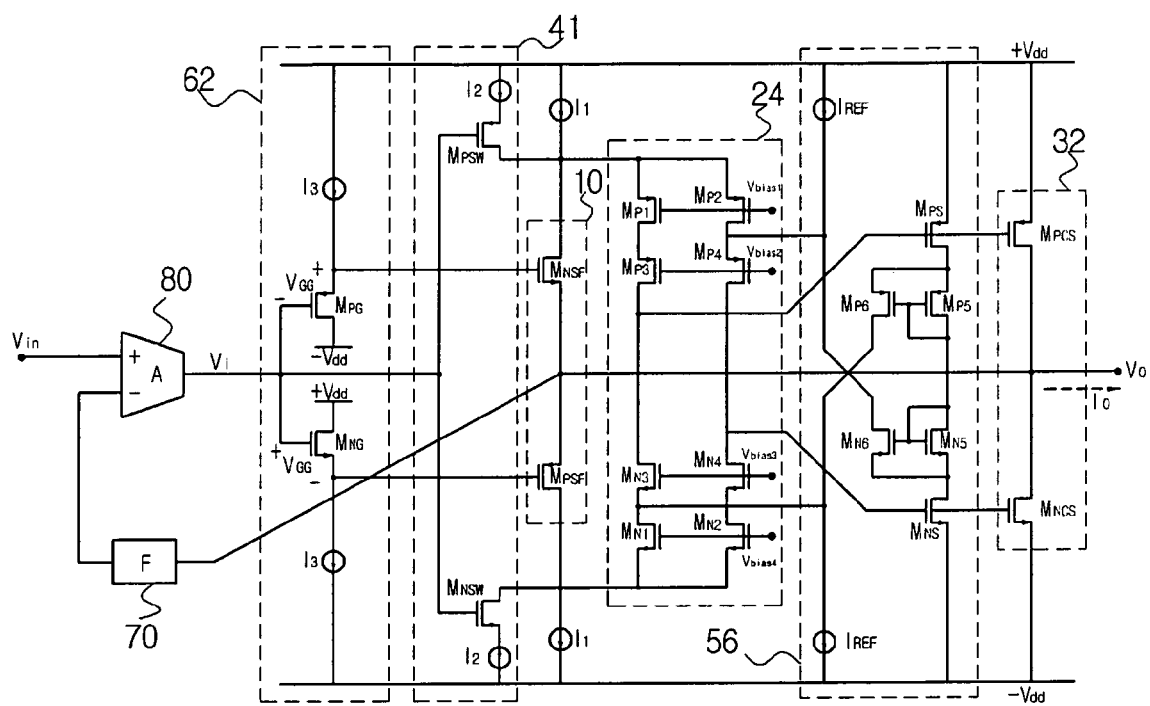
FIG. 20 is a diagram illustrating a power amplifier according to the second embodiment of the present invention.

FIG. 20 is a diagram illustrating a power amplifier according to the second embodiment of the present invention.

Differences between the power amplifiers according to the first and second embodiments shown in FIGS. 19 and 20 are structures of a driver and an output bias unit.

Referring to FIG. 20, the power amplifier according to the second embodiment is embodied by employing the driver 24 and the output bias unit 56 included in the output buffer according to the ninth embodiment of the present invention. Since the driver 24 and the output bias unit 56 were already described above, detail descriptions thereof are omitted.

In order to embody a source follower biasing block 62 used for defining a bias electric current of source followers $M_{NSF}$ and $M_{PSF}$ having a push-pull formation as shown in FIG. 19, source followers formed of $M_{PG}$–$I_3$ and $M_{NG}$–$I_3$ are used.

Figure 21:
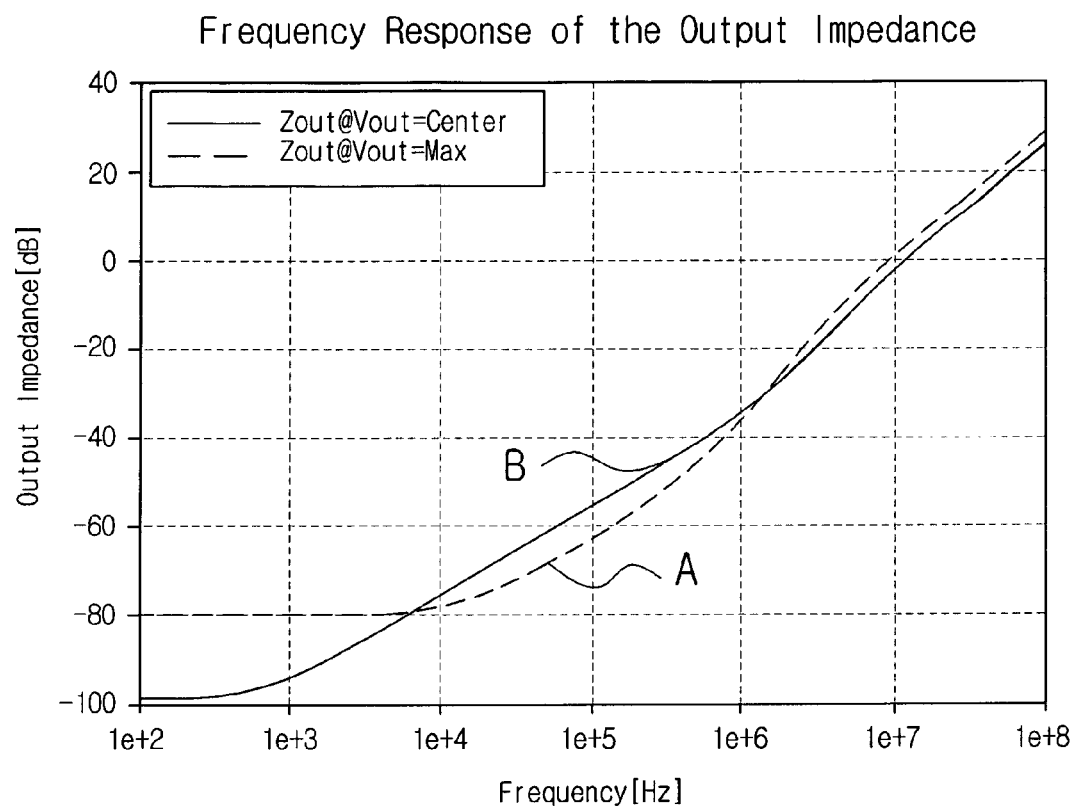
FIG. 21 is a graph showing results of simulations that obtains output impedance characteristics of a power amplifier of FIG. 20 when an output voltage is a maximum level and an output voltage is a middle level.

FIG. 21 is a graph illustrating output impedance characteristics of a power amplifier of FIG. 20 according to frequencies through simulations.

According to the power amplifier of the second embodiment shown in FIG. 20, operating zones of source followers $M_{NSF}$ and $M_{PSF}$ are decided and one of loops to be disconnected is decided according to an output voltage range. Therefore, output impedance is also influenced by an output voltage. A bandwidth of a loop must be wide for sustaining low output impedance at high frequency. Therefore, the output impedance at high frequency region is appeared as highest in a range of high output voltages because a bandwidth of a loop $M_{PSF}$-$M_{N1}$-$M_{N3}$-$M_{PCS}$ that includes a PMOS source follower $M_{PSF}$ and a PMOS common source $M_{PCS}$ is the narrowest among four loops. The output impedance for a middle level output voltage is the lowest because four loops are all formed. Referring to FIG. 21, the graph clearly shows that the output impedance less than 1Ω is sustained up to 10 MHz.

As described above, the output buffer and the power amplifier according to the present invention can effectively supply an output electric current.

Also, the output buffer and the power amplifier according to the present invention can sustain low output impedance up to a high frequency area while supplying and absorbing an electric current at any output voltages and can obtain a wide output voltage swing range.

Furthermore, the output buffer and the power amplifier can obtain further low output impedance which could not be obtained using a typical CMOS circuit by lowering low output impedance of a source follower as much as times of a negative loop gain. Moreover, the output buffer and the power amplifier can obtain a wide rail-to-rail output voltage swing range by overcoming an output voltage swing limitation caused by a source follower using a common source amplifier.

In addition, low output impedance can be sustained while sourcing or sinking an output electric current regardless of an output voltage because at least one of source followers forms a negative feedback loop with a common source amplifier without being turned off for any output voltage level according to the present invention.

Moreover, the output buffer and the power amplifier has wideband characteristics because only one low frequency pole is formed in a negative feedback loop according to the present invention. Therefore, very low output impedance can be sustained in a high frequency region.

The output buffer and the power amplifier according to the present invention may be particularly proper for a power amplifier output stage and a voltage regulator requesting low output impedance and large current-driving capability. It is expected that the demand of the output buffer and the power amplifier according to the present invention will increase due to the expansion of a mark for voltage regulators and power amplifiers.

The foregoing exemplary embodiments and aspects of the invention are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An output buffer comprising:
a push-pull circuit unit including transistors connected to each other in a push-pull formation between a high level power voltage and a low level power voltage;
an output unit connected to the high level power voltage and the low level power voltage;
a driver for driving the output unit according to a signal from the push-pull circuit unit;
wherein the push-pull circuit unit includes a NMOS source follower and a PMOS source follower, which are connected in the push-pull formation;
wherein the driver includes:
a PMOS common gate having a source connected to a drain of the NMOS source follower; and
a NMOS common gate having a drain connected to a drain of the PMOS common gate and a source connected to a drain of the PMOS source follower.

2. The output buffer of claim 1, wherein the output unit includes a PMOS common source having a source connected to the high level power voltage and a drain connected to an output node.

3. The output buffer of claim 2, wherein output impedance is lowered by forming a first negative feedback loop with the NMOS source follower, the PMOS common gate, and the PMOS common source and by forming a second negative feedback loop with the PMOS source follower, the NMOS common gate, and the PMOS common source.

4. An output buffer comprising:
a push-pull circuit unit including transistors connected in a push-pull formation between a high level power voltage and a low level power voltage;
an output unit connected between the high level power voltage and the low level power voltage;
a driver for driving the output unit according to a signal from the push-pull circuit unit; and
a rail-to-rail controller for widening a swing range of the output voltage by controlling ON-OFF of the transistors included in the push-pull circuit unit according to an input voltage.

5. The output buffer of claim 4, wherein output impedance is lowered by forming negative feedback loops with the push-pull circuit unit, the output unit, and the driver.

6. The output buffer of claim 4, wherein the push-pull circuit includes a NMOS source follower and a PMOS source follower connected in the push-pull formation.

7. The output buffer of claim 4, wherein the driver includes:
a first amplifier having an input connected to a drain of the NMOS source follower; and
a second amplifier having an output connected to an output of the first amplifier and an input connected to a drain of the PMOS source follower.

8. The output buffer of claim 4, wherein the driver includes:
a PMOS common gate having a source connected to a drain of the NMOS source follower; and
a NMOS common gate having a drain connected to a drain of the PMOS common gate and a source connected to a drain of the PMOS source follower.

9. The output buffer of claim 8, wherein the output unit includes a PMOS common source having a source connected to the high level power voltage and a drain connected to an output node.

10. The output buffer of claim 9, wherein the rail-to-rail controller includes:
a first switch for controlling ON-OFF of the NMOS source follower; and
a second switch for controlling ON-OFF of the PMOS source follower.

11. The output buffer of claim 10, wherein when the input voltage is a middle level, the first switch is turned on so as to form a first negative feedback loop with the NMOS source follower, the PMOS common gate, and the PMOS common source and the second switch is turned on so as to form a second negative feedback loop with the PMOS source follower, the NMOS common gate, and the PMOS common source.

12. The output buffer of claim 10, wherein when the input voltage is a high level, the first switch is turned off so as to form a second negative feedback loop with the PMOS source follower, the NMOS common gate, and the PMOS common source.

13. The output buffer of claim 10, wherein when the input voltage is a low level, the second switch is turned off so as to form a first negative feedback loop with the NMOS source follower, the PMOS common gate, and the PMOS common source.

14. An output buffer comprising:
   a push-pull circuit unit including transistors connected to each others in a push-pull formation between a high level power voltage and a low level power voltage;
   an output unit including common sources connected between the high level power voltage and the low level power voltage;
   an output bias unit for biasing the output unit;
   a driver for driving the output unit according to a signal from the push-pull circuit unit; and
   a rail-to-rail controller for widening a swing range of the output voltage by controlling ON-OFF of the transistors included in the push-pull circuit unit according to an input voltage.

15. The output buffer of claim 14, wherein output impedance is lowered by forming negative feedback loops with the push-pull circuit unit, the output unit, and the driver.

16. The output buffer of claim 14, wherein the push-pull circuit unit includes a NMOS source follower and a PMOS source follower connected in the push-pull formation.

17. The output buffer of claim 14, wherein the output unit includes:
   a PMOS common source having a source connected to the high level power voltage and a drain connected to an output node; and
   a NMOS common source having a drain connected to the output node and a source connected to the low level power voltage.

18. The output buffer of claim 17, wherein the rail-to-rail controller includes:
   a first switch for controlling ON-OFF of the NMOS source follower; and
   a second switch for controlling ON-OFF of the PMOS source follower.

19. The output buffer of claim 18, wherein the driver includes:
   a first amplifier having an input connected to a drain of the NMOS source follower, and an output commonly connected to the output bias unit and a gate of the PMOS common source; and
   a second amplifier having an output commonly connected to the output bias unit and a gate of the NMOS common source and an input connected to a drain of the PMOS source follower.

20. The output buffer of claim 19, wherein where the input voltage is a middle level, the first switch is turned on so as to form a first negative feedback loop with the NMOS source follower, the first amplifier, and the PMOS common source and a third negative feedback loop with the NMOS source follower, the first amplifier, and the NMOS common source, and the second switch is turned on so as to form a second negative feedback loop with the PMOS source follower, the second amplifier, and the PMOS common source, and a fourth negative feedback loop with the PMOS source follower, the second amplifier, and the NMOS common source.

21. The output buffer of claim 19, wherein when the input voltage is a high level, the first switch is turned off so as to form a second negative feedback loop with the PMOS source follower, the second amplifier, and the PMOS common source, and a fourth negative feedback loop with the PMOS source follower, the second amplifier, and the NMOS common source.

22. The output buffer of claim 19, wherein when the input voltage is a low level, the second switch is turned off so as to form a first negative feedback loop with the NMOS source follower, the first amplifier, and the PMOS common source and a third negative feedback loop with the NMOS source follower, the first amplifier, and the NMOS common source.

23. The output buffer of claim 18, wherein the driver includes:
   a common gate type of a first PMOS field effect transistor having a source connected to a drain of the NMOS source follower and a drain connected to the output bias unit; and
   a common gate type of a first NMOS field effect transistor having a drain connected to the output bias unit and a source connected to a drain of the PMOS source follower.

24. The output buffer of claim 23, wherein the output bias unit includes:
   a first translinear loop for biasing the PMOS common source; and
   a second translinear loop for biasing the NMOS common source.

25. The output buffer of claim 18, wherein the driver includes a first PMOS field effect transistor, a second PMOS field effect transistor, a first NMOS field effect transistor, and a second NMOS field effect transistor,
   sources of the first and second PMOS field effect transistors are connected to a drain of the NMOS source follower,
   a first bias voltage is supplied to gates of the first and second PMOS field effect transistors,
   a drain of the first PMOS field effect transistor is connected to a drain of the first NMOS field effect transistor,
   a drain of the second PMOS field effect transistor is connected to a drain of the second NMOS field effect transistor,
   sources of the first and second NMOS field effect transistors are connected to a drain of the PMOS source follower,
   a reference voltage is supplied to a gate of the first NMOS field effect transistor, and
   a gate of the NMOS field effect transistor is connected to the output bias unit.

26. The output buffer of claim 15, wherein the output bias unit includes:
   a third PMOS field effect transistor for sensing a main current of the PMOS common source;
   a third NMOS field effect transistor for sensing a main current of the NMOS common source; and
   an electric current selector for supplying a voltage corresponding to a smaller electric current between the main current of the PMOS common source and the main current of the NMOS common source to a gate of the second NMOS field effect transistor.

27. The output buffer of claim 26, wherein a source of the third PMOS field effect transistor is connected to a source of the PMOS common source, a gate of the third PMOS field effect transistor is connected to a gate of the PMOS common source and a drain of the first NMOS field effect transistor, and a drain of the third PMOS field effect transistor is connected to the electric current selector, and a source of the third NMOS field effect transistor is connected to a source of the NMOS common source, a gate of the third NMOS field effect transistor is connected to a gate of the NMOS common source and a drain of the second NMOS field effect transistor, and a drain of the third NMOS field effect transistor is connected to the electric current selector.

28. The output buffer of claim 18, wherein the driver includes first to fourth PMOS field effect transistors and first to fourth NMOS field effect transistors, sources of the first and second PMOS field effect transistors are connected to a drain of the NMOS source follower, the third PMOS field effect transistor is cascode-connected to the first PMOS field effect transistor, the fourth PMOS field effect transistor is cascode-connected to the second PMOS field effect transistor, sources of the first and second NMOS field effect transistors are connected to a drain of the PMOS source follower, the third NMOS field effect transistor is cascode-connected to the first NMOS field effect transistor, the fourth NMOS field effect transistor is cascode-connected to the second NMOS field effect transistor, a drain of the third NMOS field effect transistor is connected to a drain of the third PMOS field effect transistor, and a drain of the fourth NMOS field effect transistor is connected to a drain of the fourth PMOS field effect transistor.

29. The output buffer of claim 28, wherein the output bias unit controls gates of the PMOS common source and the NMOS common source by comparing a reference current with a smaller electric current between main electric currents of the PMOS common source and the NMOS common source.

30. The output buffer of claim 28, wherein the output bias unit includes:

a PMOS sensing transistor for outputting a first sensed electric current according to a main electric current of the PMOS common source;

a NMOS sensing transistor for outputting a second sensed electric current according to a main electric current of the NMOS common source; and a bias controller for controlling a gate of the PMOS common source and a gate of the NMOS common source by comparing a reference current with an electric current obtained by dividing one of the first sensed electric current and the second sensed electric current by half through current mirroring.

31. The output buffer of claim 30, wherein a channel width of the PMOS sensing transistor is narrower than a channel width of the PMOS common source, and a channel width of the NMOS sensing transistor is narrower than a channel width of the NMOS common source.

32. A power amplifier comprising:

an output buffer including a push-pull circuit unit having transistors connected to each others in a push-pull formation between a high level power voltage and a low level power voltage, an output unit including common sources connected between the high level power voltage and the low level power voltage, an output bias unit for biasing the output unit, and a driver for driving the output unit according to a signal from the push-pull circuit unit;

a rail-to-rail controller for widening a swing range of the output voltage by controlling ON-OFF of transistors included in the push-pull circuit unit according to an input voltage of the output buffer;

a feedback unit for feedbacking the output voltage to an input unit; and an amplifier for amplifying difference between an input voltage and the feedbacked output voltage.

33. The power amplifier of claim 32, wherein the push-pull circuit unit includes a NMOS source follower and a PMOS source follower connected in the push-pull formation.

34. The power amplifier of claim 33, wherein the output unit includes a PMOS common source having a source connected to the high level power voltage and a drain connected to an output node; and a NMOS common source having a drain connected to the output node and a source connected to the low level power voltage.

35. The power amplifier of claim 34, wherein the rail-to-rail controller includes:

a PMOS switch for controlling ON-OFF of the NMOS source follower; and a NMOS switch for controlling ON-OFF of the PMOS source follower.

36. The power amplifier of claim 35, wherein the driver includes first to fourth PMOS field effect transistor, and first to fourth NMOS field effect transistors, sources of the first and second PMOS field effect transistors are connected to a drain of the NMOS source follower, the third PMOS field effect transistor is cascade-connected to the first PMOS field effect transistor, the fourth PMOS field effect transistor is cascode-connected to the second PMOS field effect transistor, sources of the first and second NMOS field effect transistors are connected to a drain of the PMOS source follower, the third NMOS field effect transistor is cascode-connected to the first NMOS field effect transistor, the fourth NMOS field effect transistor is cascode-connected to the second NMOS field effect transistor, a drain of the third NMOS field effect transistor is connected to a drain of the third PMOS field effect transistor, and a drain of the fourth NMOS field effect transistor is connected to a drain of the first PMOS field effect transistor.

37. The power amplifier of claim 36, wherein the output bias unit controls gates of the PMOS common source and the NMOS common source by comparing a reference current with a smaller electric current between main electric currents of the PMOS common source and the NMOS common source.

38. The power amplifier of claim 36, wherein the output bias unit includes:

a PMOS sensing transistor for outputting a first sensed electric current according to a main electric current of the PMOS common source;

an NMOS sensing transistor for outputting a second sensed electric current according to a main electric current of the NMOS common source; and a bias controller for controlling a gate of the PMOS common source and a gate of the NMOS common source by comparing a reference current with an electric current obtained by dividing one of the first sensed electric current and the second sensed electric current by half through current mirroring.

39. The power amplifier of claim 38, wherein a channel width of the PMOS sensing transistor is narrower than a channel width of the PMOS common source, and a channel width of the NMOS sensing transistor is narrower than a channel width of the NMOS common source.

* * * * *